US006639393B2

(12) United States Patent
Tasker et al.

(10) Patent No.: US 6,639,393 B2
(45) Date of Patent: Oct. 28, 2003

(54) METHODS AND APPARATUS FOR TIME-DOMAIN MEASUREMENT WITH A HIGH FREQUENCY CIRCUIT ANALYZER

(75) Inventors: Paul Juan Tasker, Cowbridge (GB); Johannes Benedikt, Pentwyn (GB)

(73) Assignee: University College Cardiff Consultants Ltd. (GB)

( * ) Notice: Subject to any disclaimer, the term of this patent is extended or adjusted under 35 U.S.C. 154(b) by 0 days.

(21) Appl. No.: 09/997,719

(22) Filed: Nov. 30, 2001

(65) Prior Publication Data

US 2003/0102907 A1 Jun. 5, 2003

(51) Int. Cl.[7] .................. G01R 23/00; G01R 23/16; G01R 27/26; G01R 19/00; H03R 3/16

(52) U.S. Cl. .................. 324/76.19; 324/76.22; 324/658; 324/606; 324/765; 330/2; 330/251; 330/277

(58) Field of Search .......................... 324/76.19, 76.22, 324/658, 606, 765; 330/2, 251, 277

(56) References Cited

U.S. PATENT DOCUMENTS

| | | | | |
|---|---|---|---|---|
| 5,831,476 A | * | 11/1998 | Buer et al. ...................... | 330/2 |
| 6,049,219 A | * | 4/2000 | Hwang et al. .................. | 324/765 |
| 6,316,943 B1 | * | 11/2001 | Yamashita et al. ............ | 324/606 |
| 6,388,512 B1 | * | 5/2002 | Sims, III ........................ | 330/2 |
| 6,411,108 B1 | * | 6/2002 | Douglas et al. ............... | 324/658 |

OTHER PUBLICATIONS

F. Raab, "Class–F power amplifiers with maximally flat waveforms." *IEEE Trans. Microwave Theory Tech.*, vol. 45, pp. 2007–2012, Nov. 1997.

M. Sipilä, K. Lehtinen, and Veikko Porra, "High–frequency periodic time–domain waveform measurement system." *IEEE Trans. Microwave Theory Tech.*, vol. 36, pp. 1397–1405, Oct. 1988.

M. Demmler, P.J. Tasker, and M. Schlechtweg, "A vector corrected high power on–wafer measurement system with a frequency range for the higher harmonics up to 40 GHz." in 24th *European Microwave Conf.*, 1994, pp. 1367–1372.

(List continued on next page.)

Primary Examiner—Andrew H. Hirshfeld
Assistant Examiner—Wasseem H. Hamdan
(74) Attorney, Agent, or Firm—Wolf, Greenfield and Sacks, P.C.

(57) ABSTRACT

A method of measuring the response of an electronic device to a high frequency input signal is performed with an analyzer (1). The method includes providing an electronic device (for example a transistor or amplifier) to be tested, providing a measurement system (10, 11a, 11b, 12, SA, SB) including a microwave transition analyzer (MTA) (10) connected to the device, applying a signal to the device and measuring with the MTA (10) the resulting incident and reflected waves at a port (3, 4) of the device, ascertaining first calibration data regarding the measurement system (10, 11a, 11b, 12, SA, SB), processing signals representative of the waves as measured by the MTA (10), with the use of the first calibration data, to compensate for the influence of the measurement system and the connection between the MTA (10) and the device on the waves between the port (3, 4) of the device and the MTA to produce vector corrected s-parameters, ascertaining, by measuring signals at a port of the device with a real network with known properties, second calibration data concerning voltage waveforms at the port, and processing said vectors corrected s-parameters with the use of the second calibration data to produce output signals from with the absolute values of the magnitude and phase of waves at the port of the device may be directly ascertained. The method is of use in improving the efficiency and power capabilities of amplifiers for use in mobile communication base stations.

38 Claims, 9 Drawing Sheets

OTHER PUBLICATIONS

P.J. Tasker, M. Demmler, M. Schlechtweg, and M. Fernández–Barciela, "Novel approach to the extraction of transistor parameters from large signal measurements." in 24$^{th}$ European Microwave Conf., 1994, pp. 1301–1306.

D. Barataud, C. Arnaud, B. Thibaud, M. Campovecchio, J–M. Nebus, and J.P. Villote, "Measurement of time–domain voltage/current waveforms at RF and microwave frequencies based on the use of a vector network analyzer for the characterization on nonlinear devices—Application to high-efficiency power amplifiers and frequency–multipliers optimization." IEEE Trans. Instrum. Meas., vol. 47, pp. 1259–1264, Oct. 1998.

P.J. Tasker, S.S. O'Keefe, G.D. Edwards, W.A. Philips, M. Demmler, M.C. Currás–Francos, and M. Fernández–Barciela, "Vector corrected non–linear transistor characterization." in 5$^{th}$ European Gallium Arsenide Related III–V Compound Applicat. Symp. Dig., Bologna, Italy, 1997, pp. 91–94.

Y. Takayama, "A new load–pull characterization method for microwave power transistors." in IEEE MTT–S Int. Microwave Symp. Dig., 1976, pp. 218–220.

U. Lott, "Measurement of magnitude and phase of harmonics generated in nonlinear microwave two–ports." IEEE Trans. Microwave Theory Tech., vol. 37, pp. 1506–1511, Oct. 1989.

G. Kompa and F. van Raay, "Error–corrected large–signal waveform measurement system combining network analyzer and sampling oscilloscope capabilities." IEEE Trans. Microwave Theory Tech., vol. 38, pp. 358–365, Apr. 1990.

J. Verspecht, P. Debie, A. Barel, and L. Martens, "Accurate on wafer measurement of phase and amplitude of the spectral components of incident and scattered voltage waves at the signal ports of nonlinear microwave device." IEEE MTT S Int. Microwave Symp. Dig., vol. 3, May 16–20, 1995, pp. 1029–1032.

J. Verspecht and K. Rush, "Individual characterization of broad–band sampling oscilloscopes with a nose–to–nose calibration procedure." IEEE Trans. Microwave Theory Tech., vol. 43, pp. 347–354, Apr. 1994.

J. Benedikt, R. Gaddi, P. J. Tasker, and M. Goss, "High-power time–domain measurement system with active harmonic load–pull for high–efficiency base–station amplifier design." IEEE Trans. Microwave Theory Tech., vol. 48, pp. 2617–2624, Dec. 2000.

C. J. Wei, Y. A. Tkachenko, and D. Bartle, "Waveform measurement technique and its applications to optimum loading studies on power fets." in 2nd International Conf. on Microwave and Millimeter Wave Technology Proceedings, pp. 666–669, Apr. 2000.

J. Scott, B. Behnia, M. V. Bossche, A. Cognata, J. Verspecht, F. Verbeyst, M. Thorn, and D. Scherrer, "Removal of cable and connector dispersion in time–domain waveform measurements on 40Gb integrated circuits." in 2002 IEEE MTTS–S Digest, pp. 1669–1672, May 2002.

C. J. Wei, Y. A. Tkachenko, and J. C. M. Hwang, "Non–invasive waveform probing for nonlinear network analysis." in 1993 IEEE MTT–S Digest, pp. 1347–1350, Jan. 1993.

N. Boulejfen, F. M. Ghannouchi, and A. B. Kouki, "A frequency/time domain characterization technique for frequency–translating devices." in 1998 IEEE MTT–S Digest, pp. 937–940, May 1998.

C. J. Wei, P. DiCarlo, Y. A. Tkachenko, R. McMorrow, and D. Bartle, "Analysis and experimental waveform study on inverse class class–F mode of microwave power fets." in 2000 IEEE MTT–S Digest, pp. 525–528, 2000.

* cited by examiner

METHODS AND APPARATUS FOR TIME-DOMAIN MEASUREMENT WITH A HIGH FREQUENCY CIRCUIT ANALYZER

BACKGROUND

The present invention relates to analyzing the behavior of a high frequency device, in particular, a device for use in high power high frequency amplifier, such as an amplifier for use in a mobile telephone network base-station. The invention also relates to a method of improving the performance of circuits including such a device.

It is desirous to improve the efficiency and power capabilities of amplifiers for use in mobile communication base stations and therefore also to provide a design tool for designing such amplifiers. One possible method of improving the design of such amplifiers includes conducting a theoretical analysis of terminal voltage and current waveforms with the aim of analyzing and improving the modes of operation of the amplifier required for high efficiency, linearity and power. The behavior of such amplifiers, being non-linear over much of their operating range, is rather complicated and difficult to define accurately. Such theoretical analysis is therefore generally inadequate when seeking to characterize the behavior of an amplifier with sufficient accuracy to enable its performance to be improved.

Experimental measurement and analysis of waveforms (including RF load lines, for example) would not of course suffer from the disadvantages associated with theoretical analysis. However, measurement systems of the prior art are generally unable to measure the behavior of such amplifiers over a sufficiently wide power band at sufficiently high frequencies. Measurement systems having such power and frequency ratings tend to be prohibitively expensive, inefficient and/or do not provide sufficient data to facilitate the improvement of the design of circuits incorporating the device under test. In particular, one measurement method of the prior art that is able to characterize the behavior of such amplifiers, the method including using a measurement system based on a vector network analyzer (VNA), is able only to provide limited data concerning the linear behavior of the amplifier. That prior art method is not able to provide any data concerning absolute values relating to the power and relative phase of waveforms outputted by the amplifier in response to input waveforms of known frequencies nor is it a straightforward matter to obtain useful information concerning the non-linear behavior of the device.

SUMMARY

The present invention thus seeks to provide an improved method of measuring the response of an electronic device to a high frequency input signal, an analyzer suitable for use in such a method, and an improved method of designing and manufacturing a high frequency device.

According to a first aspect of the invention there is provided a method of measuring the response of an electronic device to a high frequency input signal, the method comprising the steps of a) providing an electronic device having a port able to receive and/or send high frequency signals, b) providing a measurement system including a measurement unit for measuring high frequency signals and including a signal path connecting the measurement unit to the port of the device, c) applying a signal to the device and measuring with the measurement unit via the signal path two independent waveforms at the port of the device, and d) processing signals representative of the waves as measured by the measurement system, with the use of calibration data, to compensate for the influence of the measurement system on the waves between the port of the device and the measurement unit and to produce output signals from which the absolute values of the magnitude and phase of waves at the port of the device may be directly ascertained, wherein the calibration data includes data ascertained by making measurements with a real network, the real network being connected to a portion of the signal path that in use connects to the port of the device, the influence of the real network on the measurements made with the real network being known, for example, by measuring the behavior of the real network under a plurality of conditions resulting from the application of a plurality of standards to the real network.

Thus the invention provides a method by which it is possible to ascertain the behavior of a device by obtaining data concerning the absolute values of waveforms, for example current and voltage waveforms, exhibited at the or each port of the device in response to a known input waveform. Obtaining such data will enable the design of circuits including such devices to be improved in a more efficient manner or in a more cost-effective manner than hitherto possible.

The advantages of the invention are facilitated by the calibration procedures used and in particular the use of the calibration data. (It will of course be understood that the process of calibration may in the present context simply mean improving the accuracy of the results of the measurements and/or improving the amount of information available regarding the behavior of the device.) System calibration procedures for 2-port measurement systems have been developed since the beginning of automated network analysis in the late 60's and many known calibration procedures, which allow different levels of accuracy depending on the desired application, are now available. Such calibration procedures are performed with the aim of improving accuracy and creating a well-defined measurement reference plane and are therefore very similar in function to the steps of ascertaining and using the first and second calibration data in respect of the present invention. However, most established prior art calibration procedures suffer from the disadvantage that they operate on s-parameters, which are defined as traveling wave ratios. As a consequence, only relative measurements are calibrated and absolute power and phase information of incoming and outgoing waves remain undetermined. This is a disadvantage that the present invention is able to avoid or mitigate. Thus, the accurate measurements of magnitude and phase of the traveling waves at the measurement reference plane at the port of the device under test is facilitated by the invention. The absolute voltage and current waveforms at terminals of the device may also be ascertained.

A recently proposed measurement system which also seeks to address the disadvantages associated with the prior art is built around two synchronized microwave transition analyzers (MTAs)(providing four input channels for measuring the incident and reflected waveforms at each of the two ports of the device under test), with calibration based on the availability of a multi-tone reference generator, which has an accurately known output impedance, and in respect of which the absolute amplitudes and relative phases of all frequency components are stable and accurately specified. The reference generator is itself calibrated by a broadband accurate signal analyzer, using a 'nose-to-nose' procedure (where the reference generator is linked directly to the signal analyzer). Obtaining data regarding the behavior of a device with a system that is calibrated by using a multi-tone reference generator and a broadband accurate signal generator is however very expensive. The method of the present invention does not however require the provision of such components.

It will be understood that the term "real network" as used herein covers within its scope any physical means, device or circuit that is able to carry signals from a first point to a second point. Of course, any such real network will have a influence on the signals so carried, which may be significant at high frequencies.

The calibration data is advantageously ascertained before the other steps of the method are performed. The steps of the method that require calibration data to be used may simply access the relevant calibration data from a data store, in which previously ascertained calibration data has been stored. Alternatively, the method may include steps in which the measurement system is used to ascertain the calibration data by performing one or more calibration steps. (Such calibration steps are described in more detail below.)

The device may have a plurality of ports able to receive and/or send high frequency signals. The method of the invention is able to be performed on multi-port devices, for example by conducting steps c) and d) of the invention in respect of the resulting waves at each of the ports of the device. Of course, if a device has a plurality of ports, the method may be performed in respect of one or more of the ports, but not all of the ports.

The step of applying a signal to the device is conveniently applied at one of the ports of the device. The step of applying a signal to the device and the step of measuring the resulting waveforms may be conducted in respect of the same port of the device or in respect of different ports of the device. Signals are advantageously applied such that a plurality of signals are applied having components at different frequencies so as to assess the behavior of the device over a range of frequencies. Preferably, the method is performed in respect of a multiplicity of respective applied signals having different fundamental frequencies. The fundamental frequencies of the applied signals in respect of which the behavior of the device is assessed preferably include a multiplicity of frequencies in the range between 500 MHz to 12.5 GHz and more preferably include a multiplicity of signals evenly distributed over at least a significant part of that range.

The signal(s) applied to the device preferably include a signal having a fundamental frequency greater than 500 MHz.

At least part of step d) may be so performed that it may be considered as effectively translating the measurement reference plane from the measurement unit to the port of the device. (The measurement reference plane may be considered as being the point or region of the circuit at which the signals as measured accurately represent the form of the waveform.) The ports of the device may simply be the leads of the device at their point of exit from the package of the device (for example, the terminals of the device).

The method of the invention is of particular application when the device is a non-linear device, especially where the device is to be used in an application where the operating range of the device is such that non-linear behavior is significant. A non-linear device is such that the relationship between the output voltage and the input voltage is not linear. The non-linear device may for example be a diode, a mixer, an oscillator or a frequency multiplier such as a doubler, or an amplifying device such as a transistor. The device may be a high power device. The device may be a high power amplifier. The device may for example be a device suitable for use as a high power amplifying device in a mobile telecommunications base station. In such cases, the method advantageously includes a step of applying a high power signal to the device.

The connection(s) connecting the or each signal path to the measurement unit are advantageously removable and/or switchable, so that the source of signals fed to the or each input of the measurement unit may be changed.

The measurement unit advantageously is able to measure and characterize the waveform fully across the time domain. The measurement unit is preferably able to measure accurately waveforms having fundamental frequencies over a frequency range between 500 Mhz and 12.5 GHz. Of course, the measurement unit may also be able to measure signals having frequencies outside this range. The measurement unit is preferably able to measure high voltage waveforms having fundamental frequencies above 500 Mhz. The measurement unit is advantageously a microwave transition analyzer (MTA). The MTA may have two input ports. In the case where the device is a multi-port device, the method advantageously includes a step of measuring two independent waveforms (for example incident and reflected signals) at both ports of the device. If a single MTA having only two input ports is used, the method may include switching the inputs to the MTA between the ports of the device. Preferably, the signals are switched one at a time, so that the MTA is able to maintain a consistent time reference on the waveforms measured. For example, at one moment the two inputs to the MTA may be sourced from incident and reflected waves at a first port of the device signal, and then (whilst using the reflected wave input to retain a time reference) the input of the MTA relating to the incident wave at the first port is switched to relate to the incident wave at a second port of the device, and then (whilst using the incident wave input to retain a time reference) the input relating to the reflected wave at the first port is switched to relate to the reflected wave at the second port.

Step c) of the method may include applying a waveform to the device, the waveform having a plurality of single frequency harmonic components. The waveform may, for example, include a component having a frequency substantially at a fundamental frequency and a component having a frequency substantially at a frequency equal to an integer multiple of the fundamental frequency.

In the case where the device is a multi-port device the method advantageously includes a step in which signals are simultaneously applied at both ports. In such a case the method may include a step of applying a first waveform at one port of the device, the first waveform having a fundamental frequency at a first frequency and a step of applying a second waveform at another port of the device, the second waveform having a component having a frequency substantially equal to the first frequency and having a component at a second frequency substantially equal to an integer multiple of the first frequency. Signals applied to the device may include a combination of signals at a fundamental frequency, and at least the second (twice the fundamental frequency) and third (three times the fundamental frequency) harmonic frequencies. The component at the fundamental frequency may be provided at a power more than twice as great as the power of each of the harmonic signals. The relative phases of the frequency components of the signals applied to the device are advantageously accurately pre-selectable. The magnitudes of the frequency components of the signals applied to the device are advantageously accurately preselectable. For example, there may be provided a first frequency generator able to generate signals at a first frequency at powers up to 200 W (rms), a second frequency generator able to generate signals at a frequency of twice the first frequency at powers up to 40 W (rms), and a third frequency generator able to generate signals at a frequency of three times the first frequency at powers up to 40 W (rms).

Each signal path between the measurement unit and the device preferably includes an attenuator, to reduce reflections at the measurement unit. The incident and reflected waves may be separated by a directional coupler connected to the port of the device.

A Bias T device may be provided to combine the high frequency signals with a DC signal for biasing the device. The high frequency signals may be produced by a signal generator including a signal amplifier. At least one isolator may be provided between such a signal amplifier and a port of the device to isolate the signal at the desired frequency.

The method is of course of particular advantage when the absolute values of the magnitude and phase of waves at the port of the device are directly ascertained. The method thus preferably includes a step in which the absolute values of the magnitude and phase of waves at the port of the device are directly ascertained.

The time delay between applying the signals and producing the output signals may be less than 1 minute and is preferably less than 10 seconds. The method preferably includes producing the output signals substantially in real-time. The method preferably includes producing output signals in a form able to be viewed by an operator, for example by producing a graphical output on a visual display unit, such as a computer monitor, for example.

The method advantageously includes the steps of ascertaining calibration data for use in the above-described method.

In accordance with the first aspect of the invention there is also provided a method of calibrating a measurement system for measuring the response of an electronic device to a high frequency input signal. The calibration method may comprise a step of ascertaining first calibration data regarding the measurement system, the first calibration data enabling, when the measurement system is connected to a device to which signals are applied, the processing of the resulting signals, said resulting signals being representative of independent waveforms at a port of the device resulting from the applied signals, the waveforms being measured by the measurement system via the signal path, the processing of the resulting signals compensating for the influence of the measurement system on the waves between the port of the device and the input of the measurement unit. The first calibration data is advantageously sufficient to enable signals representative of a function of the waves at the port of the device to be calculated. The method of calibrating may also comprise a step of ascertaining second calibration data concerning said function, so that when the measurement system is used to measure the behavior of a device to which the measurement system is, in use, connected, the signals as measured by the measurement unit may be processed with the use of the first and second calibration data to produce output signals from which the absolute values of the magnitude and phase of waves at the port of the device may be directly ascertained. The second calibration data is advantageously ascertained by making measurements with a real network, the real network being connected to a portion of the signal path that in use connects to the port of the device, the influence of the real network on the measurements made with the real network being known.

The method is thus advantageously performed such that the second calibration data is ascertained with a real network that has itself been calibrated. The real network may be calibrated by measuring the behavior of the real network under a plurality of conditions resulting from the application of a plurality of standards to the real network. The step of measuring the behavior of the real network may be effected by measuring waveforms, for example, voltage waveforms, with the measurement unit. The calibration of the real network may be effected by measuring waveforms, for example voltage waveforms, with the measurement unit. The waveforms so measured may be measured via at least a part of said signal path.

The real network may be directly connected to said portion of the signal path. Alternatively, the real network may be indirectly connected to said portion of the signal path. The real network may include a portion of the measurement system. For example, the real network may include at least a portion of the signal path for connecting the measurement unit to a port of the device to be tested. The real network may be connected directly to that part of the signal path that connects directly to the port of a device. Alternatively, the real network may be connected to that part of the signal path that connects directly to the port of a device via a further connection, which may for example be a part of the signal path.

The step of ascertaining the second calibration data may be ascertained by measuring signals at a port of the device.

The method of calibrating may be performed without a device to be tested being connected to the signal path or path(s). The point at which said portion of the signal path connects to the rest of the real network may be the part of the measurement system to which a port of the device to be tested may be connected. Alternatively, said portion of the signal path may connect to the rest of the real network at a topologically different point.

The first calibration data may be such that it effectively enables the measurement reference plane to be translated from the measurement unit to the ports of the device.

Of course whilst the calibration steps may be considered as two steps, one in which first calibration data is ascertained and the other in which second calibration data is ascertained, the resulting first and second calibration data may, when analyzing the behavior of a device, be used in calculations that transform the signals measured by the measuring unit into the desired output signals, such that the calibration data may be considered as forming a single set of data that enables such calculations to be made, without having to perform any calibration steps before a measurement. It may, for example, not be immediately obvious, from the calculations made, as to which of the calibration data used results from the first calibration data and which results from the second calibration data.

The first calibration data regarding the measurement system may be ascertained and used in various ways. The ascertaining and use of first calibration data may involve the use of an error model representing how signals (for example waves) or variables (for example, s-parameters) derived from signals are affected by the measurement system. The error model may be a mathematical model involving a plurality of parameters. At least the majority of the error parameters are preferably independent of the port to which the input signal is applied and the port at which the measurements are made. Preferably, the error model is substantially symmetrical. However the error model may include two parameters that allow account to be taken of the influence of the choice of ports (for example when source switching). The error model used is preferably independent of system terminations.

The signals representative of the waves measured by the measurement system may be in the form of data, for example data representative of s-parameters. The first calibration data is preferably sufficient in use of the measurement system to enable vector corrected s-parameters relating to the waves at a port of the device to be calculated. Whilst the first calibration data may be sufficient to allow the production of data representative of adjusted s-parameters, it will be understood that the production of output data from measurements made by the measurement unit need not include an intermediate step of calculating adjusted s-parameters. The processing of the signals to produce such vector corrected s-parameters may make use of an error model at least partly defined by a plurality of error parameters. The ascertaining of the first calibration data advantageously includes ascertaining the values of the error parameters of the error model. The first and second calibration data may be calculated on the basis of a network error model modeling the influence of the measurement system on waves traveling across the system wherein the error model has a plurality of unknown parameters, the model being such that at least the majority of the unknown parameters in the model are independent of the origin of the waves. The error parameters may be ascertained by any suitable method. For example the behavior of the device may be tested under controlled conditions such that the reflected and/or transmitted waveforms are set to zero, or to other such values that enable the error parameters to be derived. For example, the device may be tested under any of the following sequences of conditions: short-open-load-through (SOLT); through-match-reflect (TMR); or through-reflect-line (TRM). Such calibration conditions are standard and well known in the relevant art. Briefly, the conditions can be explained as follows:

"short"—short circuit

"open"—open circuit "load"—a load is applied across the circuit (normally the characteristic impedance at the relevant frequency)

"through"—used in two port calibrations wherein the two ports are directly connected to each other "match"—identical to load condition when the characteristic impedance is applied "reflect"—a load is applied across the circuit, the impedance not being equal to the characteristic impedance "line"—a well defined length of signal path is connected, the signal path having the characteristic impedance, the length being selected in view of the wavelength of the signal applied.

The second calibration data may be ascertained by means of connecting the measuring unit to a port of the device. The real network may comprise a connection, such as a cable or the like. The step in which the second calibration data is ascertained preferably includes providing a connection connecting a measuring unit and said at least a portion of the signal path, measuring waveforms at said portion via the connection, ascertaining the influence of the connection of the measurement of the waveforms, and then processing the measured waveforms to produce signals representative of the waveforms at said portion. The measuring unit used to measure voltage waveforms across the connection may be the measurement unit used in the other steps of the method. Thus, the behavior of the real network in response to the application of the standards may be measured by the measurement unit. The waveforms measured and processed are conveniently voltage waveforms. The connection may be a part of the analyzer. The connection is preferably a passive component. The connection is preferably shielded so that external effects do not have a significant influence on the waves traveling along the connection. The connection may be provided separately from the measurement system. The connection may be in the form of a lead, cable or the like. The connection may for example be in the form of a coaxial cable. The connection preferably connects an input of the measuring unit directly to a port of the device. The ascertaining of the influence of the connection on the measurements made may require calibration of the connection. Such a connection calibration may test a plurality of conditions of the circuit including the connection. For example, the connection calibration may include a short-open-load calibration. The connection calibration may be considered as effectively translating the measurement reference plane from the end of the connection at the measurement unit to the end of the connection at the port. The connection is preferably calibrated whilst connected to the measurement system.

The second calibration data may enable the incident and reflected voltage waveforms at the port of the device to be calculated. Steps of the calibration method may be performed in such a way that scaling parameter data is ascertained by effectively measuring waveforms at a port connectable to a device to be tested via a calibrated connection. The scaling parameter data so ascertained advantageously enables data representative of the incident and reflected voltage waveforms at the port of the device to be calculated from data/signals representative of adjusted s-parameters (for example vector corrected s-parameters) relating to the waves at the port of the device. The resulting data may require Fourier analysis to be performed on it in order to produce data representative of current and/or voltage time-domain waveforms the port of the device.

The real network is advantageously formed entirely of passive components.

Features described above may of course be combined where appropriate. For example, many of the above features are described with reference to performing the method in respect of a single port of the device, but such features may also be equally applicable to performing the method in respect of two (or more) ports of a multi-port device.

Reference is made herein to the processing of signals. It will be understood that the signals being processed may be in the form of analogue signals, such as voltage and/or current waveforms, or may be in the form of digitized data representative of such waveforms. As such the method may make use of one or more analogue to digital converters.

The present invention also provides, according to a second aspect of the invention, a method of measuring the response of an electronic device to a high frequency input signal, the method comprising the steps of:

a) providing an electronic device having a first port and a second port, the ports being able to receive and/or send high frequency signals, b) providing a measurement system including a measurement unit for measuring high frequency signals and including a first signal path connecting the measurement unit to the first port of the device and a second signal path connecting the measurement unit to the second port of the device, c) applying one or more signals to the device, measuring with the measurement unit via the first signal path two independent waveforms at the first port of the device and measuring with the measurement unit via the second signal path two independent waveforms at the second port of the device, and d) processing signals representative of the waveforms as measured by the measurement system, with the use of calibration data, to compensate for the influence of the measurement system on the waves between the ports of the device and the measurement unit to produce output signals from which the absolute values of the magnitude and phase of waves at the first port of the device and the absolute values of the magnitude and phase of waves at the second port of the device may be directly ascertained, wherein the calibration data includes data ascertained by making measurements with a real network, the real network being connected to a portion of the signal path that in use is able to connects to at least one of the ports of the device, the influence of the real network on the measurements made with the real network being known.

According to the second aspect there is also provided a method of calibrating a measurement system for measuring the response of a two port electronic device to a high frequency input signal, the method comprising the steps of:

providing a measurement system including a measurement unit for measuring high frequency signals and including a first signal path connected to a first input port of the measurement unit and enabling the measurement unit to be connected to a first port of a device and a second signal path connected to a second input port of the measurement unit and enabling the measurement unit to be connected to a second port of a device, ascertaining first calibration data regarding the measurement system, the first calibration data being sufficient to enable signals representative of waveforms measured at the input ports of the measurement unit to be processed to compensate for the influence of the measurement system on the waveforms between i) the parts of the signal paths for connecting to the ports of a device and ii) the input ports of the measurement unit so that in use of the measurement system signals representative of a function of waves at the first and second ports of a device under test may be produced, and ascertaining second calibration data concerning said function, by making measurements with a real network, the real network being connected to a portion of the signal path that in use is able to connect to at least one of the ports of the device, the influence of the real network on the measurements made with the real network being known, wherein when the measurement system is used to measure the behavior of a device, signals as measured by the measurement unit may be processed with the use of the first and second calibration data to produce output signals from which the absolute values of the magnitude and phase of waves at the first port of the device and the absolute values of the magnitude and phase of waves at the second port of the device may be directly ascertained.

According to a third aspect of the invention there is provided a method of measuring the response of an electronic device to a high frequency input signal, the method comprising the steps of:

1) providing an electronic device having a first port and a second port, the ports being able to receive and/or send high frequency signals, the device being suitable for use as a high power amplifying device in a mobile telecommunications base station, 2) providing a measurement system including a measurement unit for measuring high frequency signals and including a first signal path connecting the measurement unit to the first port of the device and a second signal path connecting the measurement unit to the second port of the device, 3) applying one or more signals to the device, so as to effect an active harmonic load pull on the device, measuring with the measurement unit via the first signal path two independent waveforms at the first port of the device and measuring with the measurement unit via the second signal path two independent waveforms at the second port of the device, and 4) processing signals representative of the waves as measured by the measurement system to compensate for the influence of the measurement system on the waves between i) the ports of the device and ii) the measurement unit and to extract output signals from which the absolute values of the magnitude and phase of waves at the first port of the device and the absolute values of the magnitude and phase of waves at the second port of the device may be directly ascertained, wherein the processing of the signals includes making use of data that has been ascertained by making measurements with a real network, the real network being connected to a portion of the signal path that in use is able to connect to at least one of the ports of the device, the influence of the real network on the measurements made with the real network being known.

The active harmonic load pull may be provided by a first frequency generator able to generate signals at a first frequency and at least one further frequency generator able to generate signals at a different frequency. For example, there may be provided a first frequency generator able to generate signals at a first frequency, a second frequency generator able to generate signals at a frequency of twice the first frequency and a third frequency generator able to generate signals at frequency of three times the first frequency.

The active harmonic load-pull is preferably applied at high power levels, preferably over 10 Watts (rms), and more preferably over 20 Watts (rms). The method preferably includes providing one or more signal generators able collectively to produce an active harmonic load-pull at power levels up to at least 30 Watts (rms).

According to the third aspect there is also provided a calibrating method including the steps of:

ascertaining first calibration data sufficient, in use of the measurement system, to ascertain vector corrected s-parameters by processing signals representative of waves as measured by the measurement system via the first and second signal paths to compensate for the influence of the measurement system on the waves between i) the ports of the device and ii) the measurement unit, providing a pre-calibrated connection between the measurement unit and a further part of the measurement system, measuring voltage waveforms via the connection, compensating for the influence of the connection on the measurement of the voltage waveforms to produce a compensated voltage waveform, and ascertaining second calibration data comprising a scaling parameter in view of the compensated voltage waveform, whereby the first and second calibration data facilitate the production of output signals relating to the behavior of a device under test, the output signals enabling the absolute values of the magnitude and phase of waves at the first port of the device and the absolute values of the magnitude and phase of waves at the second port of the device to be directly ascertained.

The present invention also provides, according to a fourth aspect, a method of measuring the response of an electronic device to a high frequency input signal, the method comprising the steps of:

i) providing an electronic device having a port, ii) providing a microwave transition analyzer (MTA) and connecting the MTA to the port of the device, iii) applying a high frequency signal to the device and measuring with the MTA two independent waveforms, the waveforms being measured at the MTA, and the MTA producing output signals as a result of the measurements made by the MTA, and iv) processing the output signals from the MTA with the use of an error model to produce data representative of current and/or voltage time-domain waveforms at the port, wherein the error model used in the processing of the output signals is a non-directional network error model and comprises parameters which have been previously ascertained. The error model may for example be substantially non-directional. The error model is advantageously such that the majority of parameters are independent of the port of the device to which a signal is applied. The method according to the fourth aspect may further include ascertaining the parameters of the error model by performing the following calibration steps:

v) applying a high frequency signal to a part of the measurement system for connecting to the device and measuring with the MTA two resulting independent waveforms under a plurality of different conditions, the waveforms being measured at the MTA, and the MTA producing output signals as a result of the measurements made by the MTA, vi) processing the output signals from the MTA to produce first data representing at least one error parameter of the error model, the processing including calculating the ratio of two incident and/or reflected voltage waveforms from the waveforms measured by the MTA, the first data being sufficient to enable the production, when measuring the response of a device, of data representative of at least one adjusted s-parameter, the adjustment compensating for the difference between the or each s-parameter as measured by the MTA and the real value of the or each s-parameter at a port of the device, vii) ascertaining a scaling parameter by connecting via a test signal path the MTA to a said part of the measurement system for connecting to the device, measuring a voltage waveform with the MTA via the test signal path, producing data regarding a compensated voltage waveform by compensating for the influence of the test signal path on the measuring of the waveform, and performing a calculation using the data regarding the compensated voltage waveform to ascertain the scaling parameter, and viii) calculating at least one error parameter from the scaling parameter.

The error parameter(s) calculated from the scaling parameter(s) may simply be equal to the scaling parameter(s).

The measurement system suitable for performing the method of the fourth aspect may be calibrated by ascertaining the error parameters by performing steps v) to viii) of the method. The error parameters advantageously enable the measurement system to process signals measured by the measurement unit during analysis of the behavior of a device under test to produce signals representative of absolute current and voltage time-domain waveforms at a port of the device under test.

The steps of the methods described above may be performed in any order that achieves the desired results.

The present invention also provides according to a fifth aspect of the invention a waveform analyzer for measuring the response of an electronic device to a high frequency input signal, the analyzer including:

an input connection for connecting to a port of a device to be analyzed, a measurement system including a measurement unit and a signal path, the signal path connecting the measurement unit to the input connection, the analyzer being so arranged that the measurement unit is able to measure in use via the signal path independent waveforms at the port of the device, a signal generator able to send high frequency signals to a port of a device to be analyzed, a processor connected to the measurement system, and a data store for holding data accessible by the processor, wherein the processor is programmed to be able, in use of the analyzer:

to process signals received from the measurement unit, to access calibration data held in the data store, to process data representative of waves as measured by the measurement system, and to compensate, with the use of the calibration data, for the influence of the measurement system on the waves between the port of the device and the measurement unit, and to produce output data from which the absolute values of the magnitude and phase of waves at the port of the device may be directly ascertained, and wherein the processor is so programmed and the analyzer is so arranged that at least a portion of said calibration data may be ascertained by making measurements with a real network, the real network being connected to a portion of the signal path that in use connects to the port of the device, the influence of the real network on the measurements made with the real network being known.

The processor of the analyzer is preferably programmed to be able, in use of the analyzer, to ascertain the calibration data and to store the calibration data in the data store. The measurement unit is preferably an MTA. At least a part of the processor may be in the form of a suitably programmed computer.

There is also provided, in accordance with a sixth aspect of the invention, a waveform analyzer for measuring the response of an electronic device to a high frequency input signal, the analyzer including:

connection means for connecting to one or more ports of a device to be analyzed, measuring means for measuring via one or more signal paths independent waveforms at the connection means, signal generating means for sending high frequency signals to a port of the device to be analyzed, processing means for processing signals from the measuring means, and calibrating means for ascertaining calibration data, wherein, in use of the analyzer when at least one port of a device is connected to the connection means, the device receiving signals from the signal generating means, the processing means is able:

to process data representative of waves as measured by the measuring means, both to compensate for the difference between the waves as measured and the waves at the or each of said one or more ports, and to produce output data from which the absolute values of the magnitude and phase of waves at the or each of said one or more ports of the device may be directly ascertained, and wherein the analyzer is so arranged that the processor makes use of data that has been ascertained by making measurements with a real network, the real network being connected to a portion of the signal path that in use connects to the port of the device, the influence of the real network on the measurements made with the real network being known.

The connection means may be in the form of any suitable connection between the measuring means and the device. The exact form of the connection means may of course depend on the type of device being analyzed. The measuring means may be a MTA in the form described below with reference to the drawings or may be in the form of any other suitable signal measuring device. The signal generating means may be formed of many separate components including for example one or more of the group consisting of a single frequency signal generator, a signal splitter, a signal amplifier, a multiplexer or signal combining means, a phase shifter, a frequency multiplier. The signal generating means may be in the form of a signal generator able to produce an accurately definable waveform being a combination of one to ten simple harmonic waveforms. The processing means may be in the form of a computer, such as a suitably programmed stand alone computer, or in the form of a dedicated processor. The calibrating means may be provided separately from the processing means. The processing means may form at least a part of the calibrating means.

The independent waveforms mentioned above advantageously include two types of waveform selected from the group consisting of the resulting incident waveform, the resulting reflected waveform, the resulting current waveform and the resulting voltage waveform.

The waveform analyzer according to either of the above-described fifth and sixth aspects of the present invention is preferably so configured as to be able to perform the method of the present invention according to any of the first to fourth aspects of the invention herein described. For example, the apparatus may be configured to analyse the behavior of a multiport device by applying signals to the device, measuring the response at at least two ports of the device and calibrating those measurements. Also, the method of the present invention according to any of the aspects of the invention herein described may be performed using a waveform analyzer according to either of the above-described aspects of the present invention.

The present invention also provides according to a seventh aspect of the invention a method of improving the design of and manufacturing a high power high frequency electronic circuit, such as a signal amplifier, the method including the steps of analysing, in accordance with the present invention, a device, such as an amplifying device for example a transistor, outputting data relating to current and voltage waveforms measured in respect of the device, varying harmonic loads on the device, analysing the outputted data relating to current and voltage waveforms to assess the loads that might facilitate a better performance of the device, and designing and manufacturing an improved high power high frequency electronic circuit including the device, the circuit being improved in design as a result of the analysis so performed.

The performance of the circuit may for example be improved by improving one or more of the efficiency gain, or maximum power output of the circuit device. The circuit may be improved in design by varying the bias point or drive level of the device or by varying the harmonic tuning of the circuit. The method of analysis of the invention may also be used to tune circuits including electronic devices, by analyzing the behavior of the device. Such tuning may be of particular advantage when manufacturing circuits including such a device, where different devices made to the same specification differ in behavior to an extent that significantly affects the efficient operation of the circuit.

The invention also provides a method of measuring the response of an electronic device to a high frequency input signal, the method comprising the steps of:

a) providing an electronic device having a first port and a second port, the ports being able to receive and/or send high frequency signals, b) providing a measurement system including a measurement unit having at least two inputs for measuring high frequency signals, and including signal paths able to connect the inputs of the measurement unit to the first and second ports of the device, c) applying one or more signals to the device, measuring with the measurement unit via the signal paths two independent waveforms from the first and/or second ports of the device, d) switching the signal source to which an input of the measurement unit is connected whilst using the signal at a different input of the measurement unit to maintain a time reference, and e) processing signals representative of the waves as measured by the measurement system, with the use of calibration data, to compensate for the influence of the measurement system on the waves between the first and second ports of the device and the measurement unit and to produce output signals from which the absolute values of the magnitude and phase of waveforms at the first and/or second port of the device may be ascertained.

It will be understood that any features of the above described aspects of the invention may be incorporated into other aspects of the present invention. For example, features described with reference to the first aspect of the invention may be incorporated with suitable changes into other aspects of the invention.

BRIEF DESCRIPTION OF THE DRAWINGS

An embodiment of the invention will now be described, by way of example only, with reference to the accompanying schematic drawings of which.

DETAILED DESCRIPTION

The embodiment described below is also described in a paper entitled "High Power Time Domain Measurement System with Active Harmonic Load-Pull for High Efficiency Base Station Amplifier Design" published in December 2000 in IEEE Transactions on Microwave Theory and Techniques (Vol. 48, No. 12 - publisher identification number S 0018-94800(00)10737-9), the contents of which are incorporated herein by reference.

Figure 1:
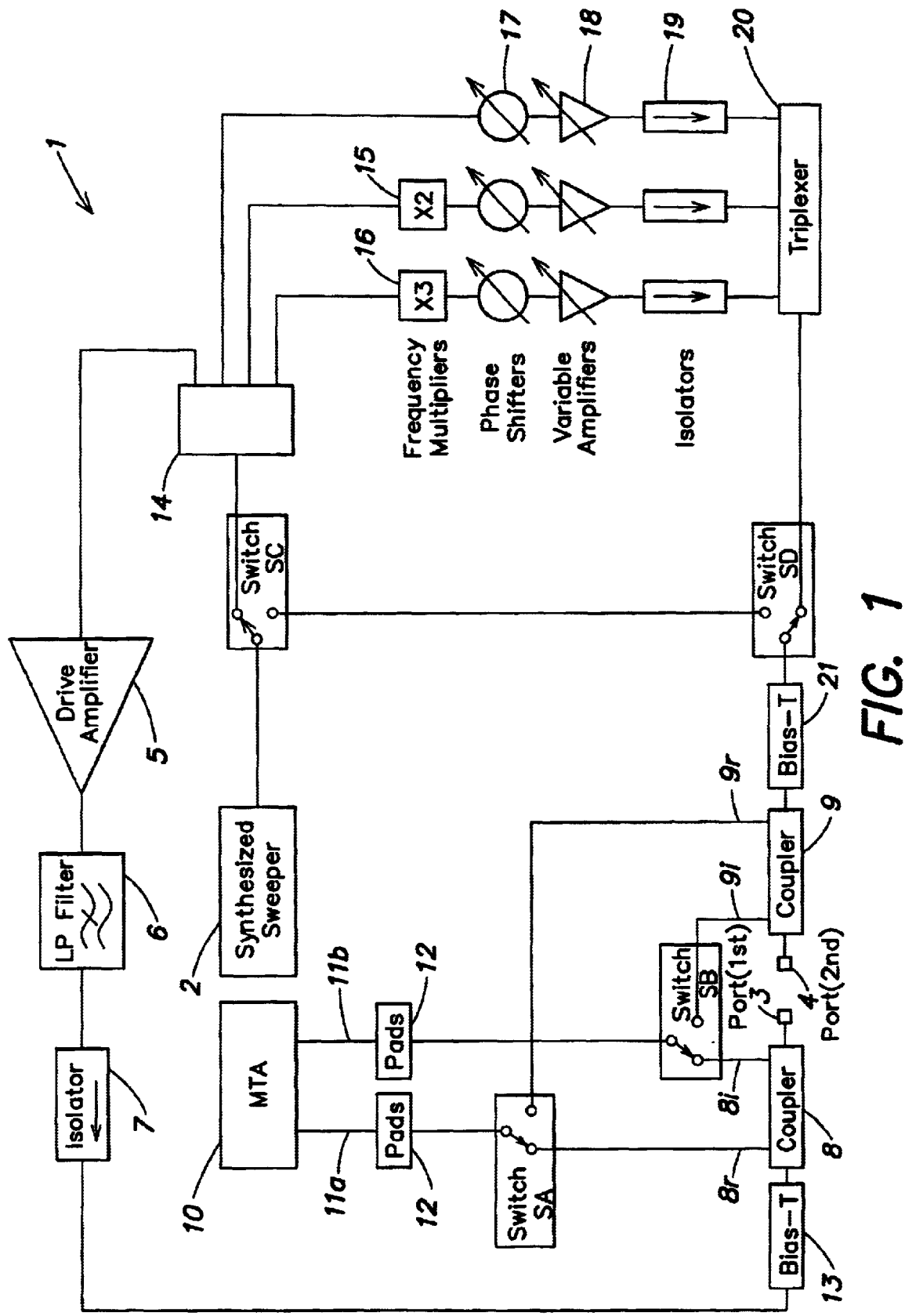
FIG. 1 shows a schematic circuit diagram of an analyzer for analyzing a 2-port LDMOS device.

FIG. 1 shows a schematic circuit diagram of an analyzer 1 for measuring the response of an electronic device (hereinafter device under test or DUT) to a high frequency and high power input signal (the DUT is not shown in FIG. 1). The analyzer 1 has time domain high power testing capabilities and is also able to apply an active load-pull involving three harmonics to the device under test. The analyzer 1 is based on a two channel sampling oscilloscope and test set. The analyzer 1 comprises a synthesized sweeper source signal generator 2 connected to two ports 3, 4 to which a DUT (not shown) is attached. The DUT is a 2-port LDMOS packaged device mounted on a microstrip-based fixture. The source signal is directed to either port 3, 4 by two switches SC and SD. A 200 W solid-state drive amplifier 5 for amplifying signals at a fundamental frequency, is connected to the first port 3 via a low-pass filter 6, provided to suppress any harmonic content generated by the drive amplifier 5, and an isolator 7, for isolation at the fundamental frequency. The drive amplifier 5 has a frequency bandwidth of 1.8 to 2.0 GHz.

The active load pull capability of the analyzer 1 is provided by an active harmonic load-pull circuit implemented to have a feed-forward architecture. A four-way power splitter 14 provides four fundamental frequency signals of which one is fed to the drive amplifier 5 (mentioned above). Of the other three signals, one is used directly to actively load pull the DUT at the fundamental frequency. A frequency doubler 15 and a frequency tripler 16 provide a second harmonic signal component and third harmonic signal component for the active harmonic load pull. All three signal components can be changed individually in phase (by phase shifters 17) and magnitude (by variable amplifiers 18) allowing the resulting three harmonic loads to be set anywhere on the Smith chart. The three signals, after each signal has passed through its respective phase shifter 17 and variable amplifier 18, pass via respective isolators 19 (in order to reduce or remove any external effects due to unwanted signals in the circuit), and are then combined by a triplexer 20. The maximum output powers of the solid state variable amplifiers 18 determine the maximum magnitude of the load pull signals. In the present embodiment the power ratings are 200 W at the fundamental frequency and 40 W at the second and third harmonic frequencies. The active load pull circuit is connected to the second port 4, via a Bias-T device 21 and a sensing coupler 9 (described in further detail below). The system configuration is such that packaged devices may be tested and load-pull measurements may be performed up to a 30 W output power level.

In order to characterize a two-port device it is necessary to analyse four parameters. The analysis of the four parameters in this embodiment involves measuring the incident and reflected waveforms at each of the two ports 3, 4 connected to the DUT. Two directional couplers, 8, 9, one connected to each port 3, 4, act on waveforms at the ports 3, 4 to produce signals (at outputs 8i, 8r, 9i, 9r of the couplers) split into incident and reflected waves, thereby producing four coupled waveforms. A microwave transition analyzer 10 (MTA) has two input channels 11, which receive two of the four coupled waveforms via switches SA and SB. Switch SA determines which of i) the de-coupled incident waveform at the first port 3 and ii) the de-coupled incident waveform at the second port 4 is forwarded to the first input channel 11a of the MTA 10. Switch SB determines which of i) the de-coupled reflected waveform at the first port 3 and ii) the de-coupled reflected waveform at the second port 4 is forwarded to the second input channel 11b of the MTA 10.

However, in order to produce output data with relative phase information regarding the waveforms it is necessary to maintain a constant time reference between the waveforms measured by the MTA 10 (at the two input channels of the MTA). When switching between inputs to the MTA 10 by switches SA and SB it is therefore necessary to maintain a time reference. When switching from two waveforms of the four waveforms to be measured to the other two waveforms, the switches must be activated one at a time. For example, at one moment (the situation shown in FIG. 1) the switches SA and SB are set so that incident and reflected waves are sourced from the first port 3. In order to change the inputs received by the MTA 10 to be those sourced from the second port 4, it is necessary perform the following steps:

using the reflected wave input from the first port 3 (signal 8r) to retain a time reference, switch SB is switched so that input channel 11b of the MTA 10 receives the incident waveform from output 9i of the coupler 9 at the second port 4; and then whilst using the incident wave input received at channel 11b from output 9i of the second port 4 as a time reference, the input relating to the reflected wave at the first port 3 (output 8r) is switched by switching switch SA so that the input at input channel 11a of the MTA 10 relates to the reflected wave at the output 9r of the coupler 9 at the second port 4. Thus the reflected and incident signals are able to be switched from one port 3, 4 to another 3, 4 without losing the time reference.

Each channel 11 of the MTA 10 has a microwave sampler able to measure the voltage of the waveform at a given instant. Attenuators 12 are inserted in front of each input channel 11 of the MTA 10 to avoid saturation of the MTA 10. The MTA 10 measures the voltage values of the coupled signals in the time domain through a sampler based broadband down-conversion technique resulting in the incoming high frequency signal being converted into a lower frequency signal (the incoming high frequency signal is assumed to be substantially periodic). The down conversion technique is effected by the MTA 10 measuring the waveforms by means of combining the input signal with a comb signal, the comb signal being at a frequency significantly lower than the fundamental frequency of the input waveform. Such a combination results in the voltage of the waveform effectively being measured at successive points along the waveform, the waveform for example being sampled once every n periods of the waveform. (It will be appreciated however that such measurement techniques may rely on the shape of the waveform changing at a much slower rate than the time required by the measurement technique to obtain an accurate representation of the waveform.) The resulting low frequency signal is then digitized by an analogue-to-digital converter (ADC) (not shown). The measured incident and reflected voltage waveforms, Vi and Vr, are directly related to the a- and b-traveling waves, and $Z_0$ (the characteristic impedance) by equations (1) and (2) shown below:

$$\vec{a} = \frac{\vec{V}^i}{\sqrt{Z_0}} \quad (1)$$

$$\vec{b} = \frac{\vec{V}^r}{\sqrt{Z_0}} \quad (2)$$

A processor (not shown) calculates s-parameters by taking the ratio of only the fundamental components (calculated by a Fourier transform) of the a- and b-waves (i.e. so that s=b/a), as calculated from, equations (1) and (2) above.

The MTA 10 is able to effect measurement of signals ranging from 0.5 to 12.5GHz. A high power bias T device 13 with a bandwidth of 1.3 to 9 GHz is provided between the drive amplifier 5 and the first port 3 to facilitate the analysis of the high power characteristics of the device. The bias T 13 is able to operate effectively up to at least a continuous wave power of 30 W and a DC current of 10 A.

The waveforms measured by the MTA are of course those received at the MTA via the switches SA, SB, attenuators 12 and the signal paths connecting those components. The waveforms as measured are therefore not an accurate reproduction of the waveforms at the ports of the DUT connected to the first and second ports 3, 4. Thus, a calibration calculation is carried out by the processor in order to compensate for the influence of those components and signal paths on the waveforms between the ports of the DUT and the point of measurement in the MTA 10. Such a step can be considered as effectively shifting the measurement plane form the MTA 10 to the leads of the package of the DUT. The calibration method operates on the s-parameters as calculated by the processor (see above) to produce vector corrected s-parameters by means of a through reflect load (TRL) calibration.

As mentioned above, the active load pull circuit is connected to the second port 4, via the sensing coupler 9, and does not therefore have a significant influence on the characteristic of the path between the second port 4 and the MTA 10, thereby allowing the synthesized load to be applied and measured without requiring any calibration steps to compensate for the influence of the load pull circuit.

The calibration method used to produce vector corrected s-parameters is performed by a processor, which in the present embodiment in the processor of a computer (not shown) programmed with appropriate software (for example, the PC based HP-Basic control software). The calibration to produce vector corrected s-parameters will now be described in detail.

Figure 2A:
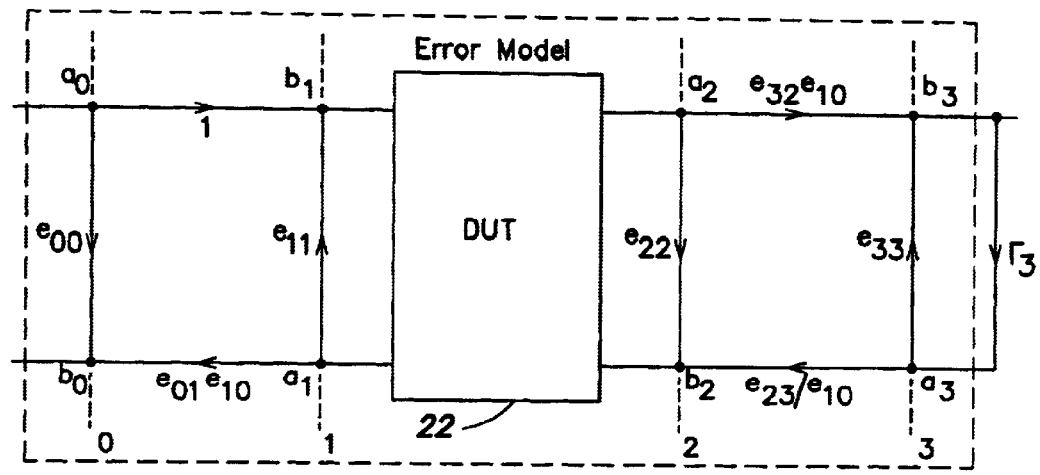
FIGS. 2a and 2b show error models used in a calibration of a measurement system of the analyzer.
Figure 2B:
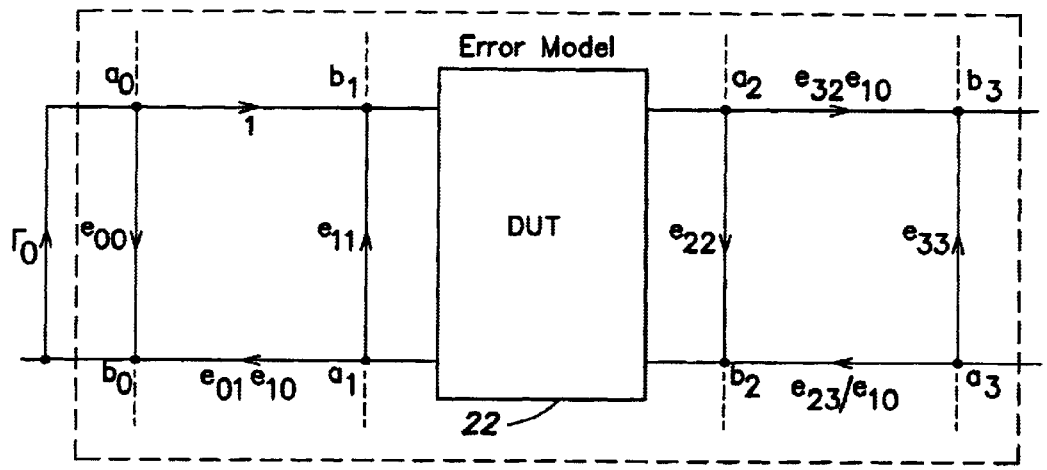

The calibration is based on a reformulation of the conventional 12-term directional error model of a four-sampler measurement system for s-parameter measurements. Conventional error models require two different, but analogous, models to represent the forward and reverse measurement states, each model having its own set of error coefficients to account for source switching issues inherent with non-ideal reflectometers. The error model utilised in the present embodiment is shown in FIGS. 2a and 2b illustrating the forward and reverse modes respectively. The error model, which is indicated by the dashed box around the DUT (represented by box 22), does not depend on measurement direction or terminations. The error model (in which isolation terms have been omitted for simplicity) fulfils two main criteria required for an error model that can be extended to absolute vector corrected waveform measurements, namely (1) it is non-directional and independent from system terminations and (2) correction at both ports at the same time is possible (i.e. all four reference planes are present in the model).

The error model as shown in FIGS. 2a and 2b shows how error parameters (or error terms) $e_{nm}$ relate to the incident traveling waves $a_p$ and the reflected traveling waves $b_q$. The measured waveforms $a_0$, $b_0$ (from the first port 3) and $a_3$, $b_3$ (from the second port 4) yield the s-parameters $s_0$ and $s_3$. For example, in the forward mode (shown in FIG. 2a) the measured waveforms $a_0$, $b_0$ at the input to the MTA 10 depend on the actual waveforms $a_1$, $b_1$ at the port of the DUT connected to the first port 3 by the equations $b_0=e_{00}a_0+e_{01}e_{10}a_1$ and $b_1=a_0+e_{11}a_1$ and the s-parameter by the equation $s_{00}=b_0/a_0=e_{00}+e_{01}e_{10}$ $\Gamma_{DUT}/(1-e_{11}\Gamma_{DUT})$, where $\Gamma_{DUT}$ is the reflection coefficient of the DUT 22 (i.e. $\Gamma_{DUT}=a_1/b_1$). In the reverse mode (shown in FIG. 2b), $b_2=e_{22}a_2+e_{23}a_3/e_{10}$ and $b_3=e_{32}e_{10}a_2+e_{33}a_3$, so that the s-parameter $s_{33}=b_3/a_3=e_{33}+e_{23}e_{32}$ $\Gamma_{DUT}/(1-e_{22}\Gamma_{DUT})$, where $\Gamma_{DUT}$ is the reflection coefficient of the DUT 22 (i.e. $\Gamma_{DUT}=a_2/b_2$).

The MTA 10 is configured in such a way that the measurements thereby made are, internally calibrated if necessary, so that the influence of the MTA 10 on the measurements made do not need to be accounted for. Apart from terms relating to the source switch non-idealities (the two match error terms $\Gamma_0$ and $\Gamma_3$), the error model is symmetrical and only one set of error terms need define the system in both forward and reverse modes. The two match error terms $\Gamma_0$ and $\Gamma_3$ can be simply measured during calibration by configuring the system source switch to run the directional couplers 8, 9 backwards. For example during the standard through line forward measurement, inverse $e_{33}$, obtained by measuring $1/e_{33}$ while sourcing from port 1 (forward), gives the ratio $a_3/b_3$, which is the wanted source switch match $\Gamma_3$. The error parameters of the error model are ascertained by a Through-Line-Reflect (TLR) calibration, under the control of the software. Other calibration methods, such as Short-Open-Load-Through (SOLT) and Through-Match-Reflect (TMR), could also be used to ascertain the error parameters.

The resulting error model after s-parameter calibration can simply be extended for absolute magnitude and phase correction of the traveling waves, through a further calibration step, which will be referred to as 'power calibration', which determines the scaling parameter $e_{10}$. The response coefficient $e_{10}$ is equal to the ratio $a_1/a_0$ (see FIGS. 2a, 2b and 3) and is ascertained by effectively measuring with the MTA the wave magnitude and phase at the reference plane at the port of the DUT connected to the first port 3. The actual measurement is performed by attaching a coaxial cable from a port of the MTA 10 and then the processor translates the measurement reference plane from the MTA 10 to the relevant port of the DUT.

In order to perform such a translation the cable (not shown) need to be calibrated. After inserting a through line between the two measurement ports 3, 4, a cable (not shown) is connected at the end of the directional coupler 8 connected to the first port 3. (Alternatively the cable could be connected to the load switch SD.) A one port Short-Open-Load calibration is then performed at the free end of the cable, the MTA 10 measuring the resulting incident and reflected waveforms via either or both the couplers 8, 9. The calibration so performed allows the processor to compensate for the influence of the cable on the measurements made via the cable. Then a through calibration step is performed by attaching the free end of the cable to one of the inputs 11a of the MTA 10. The voltage waveforms at the inputs at the MTA 10 consist of a waveform from which the voltage waveform at the first port 3 may be calculated (because the characteristics of the cable are now known) and a waveform relating to the voltage waveform at the second port 4. Because the voltage waveforms at ports 3 and 4 are identical or are related to each other by a known relationship (owing to the through connection between the two ports 3, 4), the influence of the rest of the measurement system (between the second port 4 and the other input channel of the MTA 10) may be ascertained by the processor. The processor may then transform the wave measurements measured at the inputs 11a, 11b of the MTA 10 back to the measurement reference plane of either the first port 3 or the second port 4. Thereafter, any ratio of waveforms measured from the first or second ports 3, 4, may be split into absolute waveforms. The vector corrected s-parameters (the ratio of the voltage at the fundamental frequency of the voltage wave traveling from the first port 3 to the second port 4 to the voltage at the fundamental frequency of the voltage wave traveling from the second port 4 to the first port 3) at the second port 4 are known from the calibration procedure described above. The voltage waveform traveling from the second port 4 to the first port 3 is known by the use of the through measurement using the cable, that voltage waveform being either the denominator or the numerator of the above-mentioned ratio. Thus, the other of the denominator or the numerator may then be ascertained. Therefore, when measuring the behavior of a device, the processor and the measurement system are able to derive vector corrected s-parameters and incident and reflected waveforms and/or current and voltage waveforms at the second port 4. The same process as described above may be performed in order to enable the same information to be ascertained at the first port 1. Alternatively, the above process may be sufficient to enable such information to be ascertained by means of a mathematical relationship between the first and the second ports 3, 4.

Figure 3:
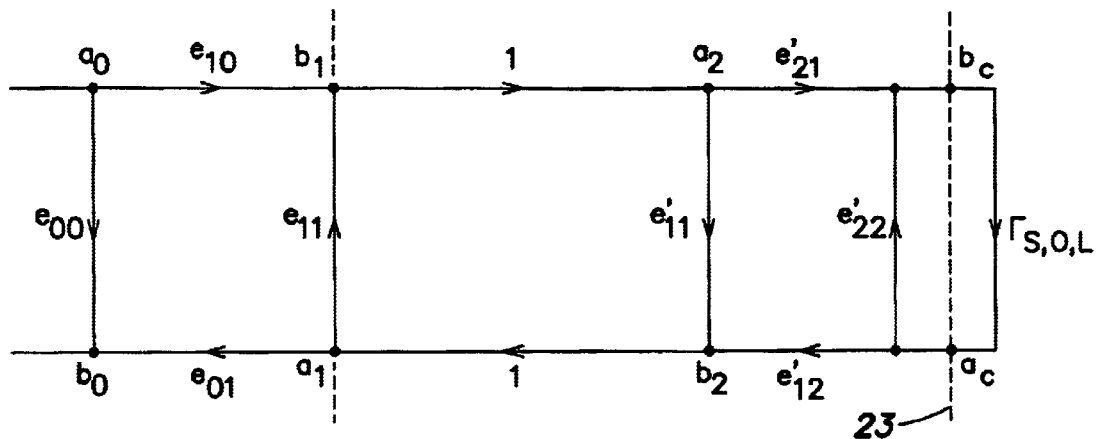
FIG. 3 shows a modified error model after insertion of a coaxial cable for performing a power calibration step.

FIG. 3 depicts the flow graph of the modified system after insertion of the coaxial cable, and the response parameters ($e'_{11}$, $e'_{21}$, $e'_{12}$, $e'_{22}$) associated to the network between the first port 3 and the coaxial cable reference plane represented by dashed line 23. Symmetry of the response behavior of this network is assumed, hence the response parameter $e'_{21}$ can be calculated. At this stage connecting the coaxial cable into the b traveling wave measuring channel of the MTA changes the system topology, allowing for the through measurement of the ratio $\Gamma_T = b_c/a_0$. The response error coefficient $e_{10}$ can finally be calculated:

$$e_{10} = \frac{\Gamma_T(1 - e_{11}e'_{11})}{e'_{21}} \qquad (3)$$

After the coefficient $e_{10}$ has been extracted, since this is the error model scaling factor, the remaining transmission coefficients can be calculated:

$$e_{32} = e_{10}e_{32}/e_{10} \quad e_{01} = e_{10}e_{01}/e_{10} \quad e_{23} = (e_{23}/e_{10}) \cdot e_{10} \qquad (4)$$

Figure 4:
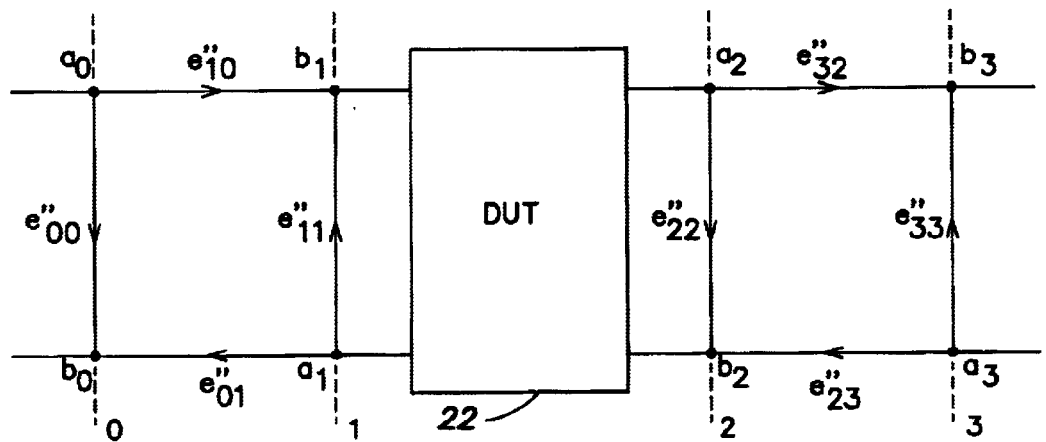
FIG. 4 shows a complete system error model for a waveform vector correction method used in the method of the embodiment.

The completely extracted error model, shown schematically in FIG. 4, allows absolute magnitude and phase of the traveling waves at the DUT reference planes to be simply de-embedded from the raw measured waves:

$$b_0 = e''_{00}a_0 + e''_{01}a_1$$

$$b_1 = e''_{10}a_0 + e''_{11}a_1$$

thus:

$$b_1 = (e''_{10} - e''_{00}e''_{11}/e''_{01})a_0 + e''_{11}/e''_{01}b_0$$

$$a_1 = (-e''_{00}/e''_{01})a_0 + 1/e''_{01}b_0 \qquad (5)$$

Also, $$s_{00} = b_0/a_0$$

$$s_{11} = b_1/a_1$$

Therefore $$s_{11} = (s_{00} - e''_{00})/(e''_{11}s_{00} + e''_{01}e''_{10} - e''_{00}e'')$$

In the above equations and the attached Figures, error terms relating to FIGS. 2a & 2B are distinguished from those relating to FIG. 4 by the use of double inverted commas. For example, $e''_{01}$ relates to FIG. 4 and $e_{22}$ relates to FIGS. 2a and 2B. However, in the present embodiment the values of an error parameter in FIGS. 2a, 2b is equal to the value of the corresponding error parameter in FIG. 4. For example $e''_{01} = e_{01}$.

Voltage and current time domain waveforms are finally obtained by the processor, through inverse Fast Fourier Transforms (FFT), from all the relevant frequency components of the calibrated traveling waves. The waveforms are then displayed on a visual display unit (such as a computer monitor) in real-time allowing the operator of the analyzer 1 to assess the change in the measured data in response to a variation in measurement set up, for example by varying the bias point, the drive power level or device load.

Figure 5:
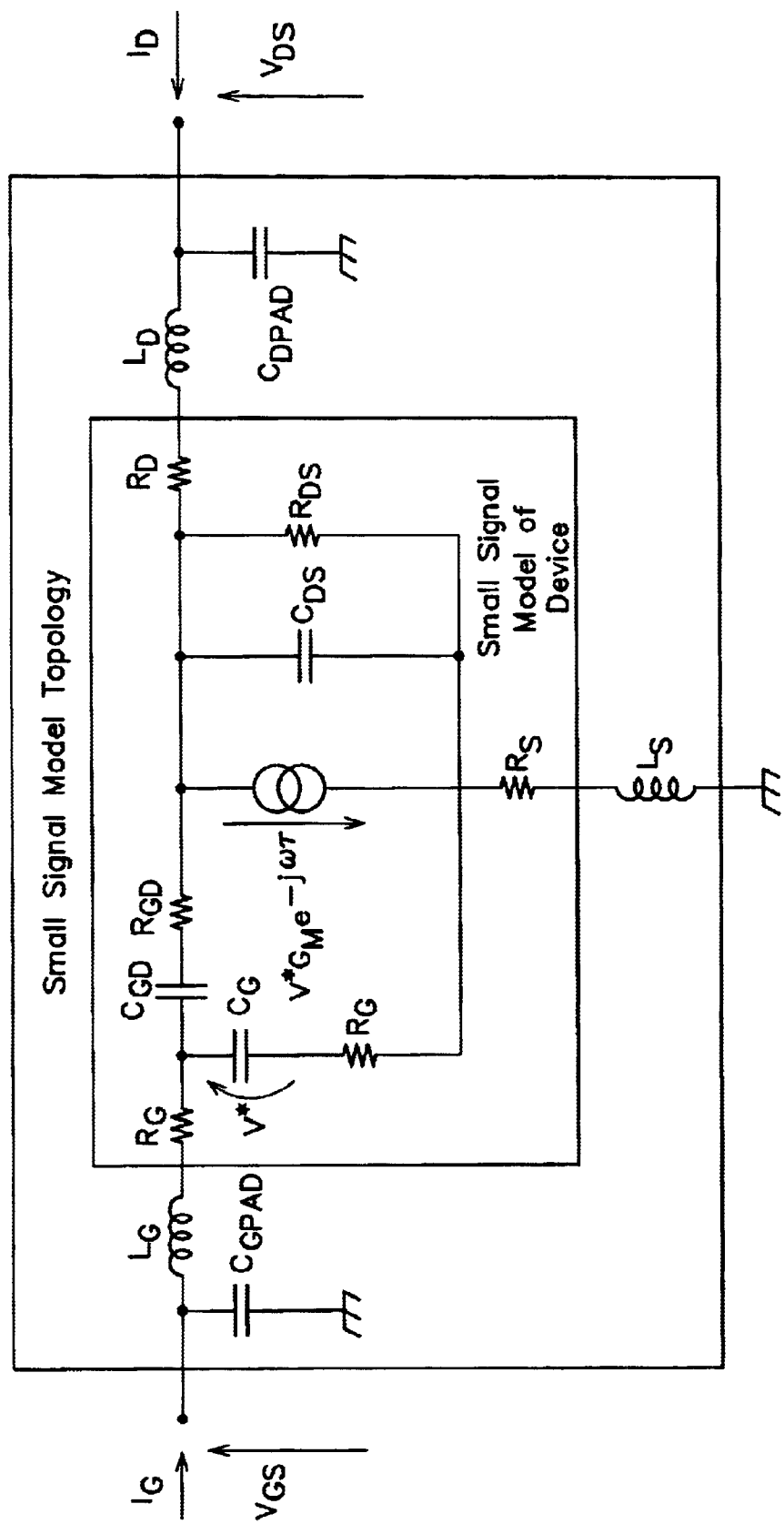
FIG. 5 shows a small signal model topology adopted for the device.

The method of the above embodiment is performed over a wide frequency range (for example over the range 1 GHz to 10 GHz) and at a various bias points. For a meaningful interpretation of the results obtained all reactive elements need to be characterized and de-embedded. The s-parameter data of the device, obtained from the same measurement system, allows for the extraction of a simple small signal model, which includes parasitic effects. FIG. 5 shows the adopted model, with the device surrounded by the parasitic effects associated to the package. This model topology achieves reasonable fit of the s-parameter data at various bias points across the region of operation. The values for package reactances and device capacitances, which are utilized in the data analysis that follows, are extracted from s-parameters at the quiescent point of large signal operation ($V_{DS,Q}$=26 V $I_{DS,Q}$=260 mA). The measured s-parameters compared favourably with the model results. The extracted parameter values are shown below:

| | |
|---|---|
| $C_{GPAD}$ | 610 fF |
| $C_{DPAD}$ | 440 fF |
| $L_G$ | 1.27 nH |
| $L_D$ | 1.10 nH |
| $L_S$ | 55 pH |
| $R_D$ | 1.1Ω |
| $C_{GS}$ | 9.38 pF |
| $C_{GD}$ | 144 fF |
| $C_{DS}$ | 2.95 pF |
| $R_{GS}$ | 2.1Ω |
| $G_{DS}$ | 1.58 mS |
| $G_M$ | 350 mS |
| Tau | 20 ps |

The reactive parasitic elements can now be de-embedded from the measured waveforms: hence, shifting the measurement reference planes. The time domain output current and voltage data graphs shown in the figures are shifted to the output current generator plane, so as to illustrate better the intrinsic behavior of the DUT.

Also, small signal s-parameters obtained from the analyzer 1 were compared with measurements performed using an HP8510C machine (available from Hewlett Packard). The degree of correspondence was better than −45 dB, thereby validating the ability of the analyzer to ascertain with accuracy s-parameters at small signals.

Figure 6:
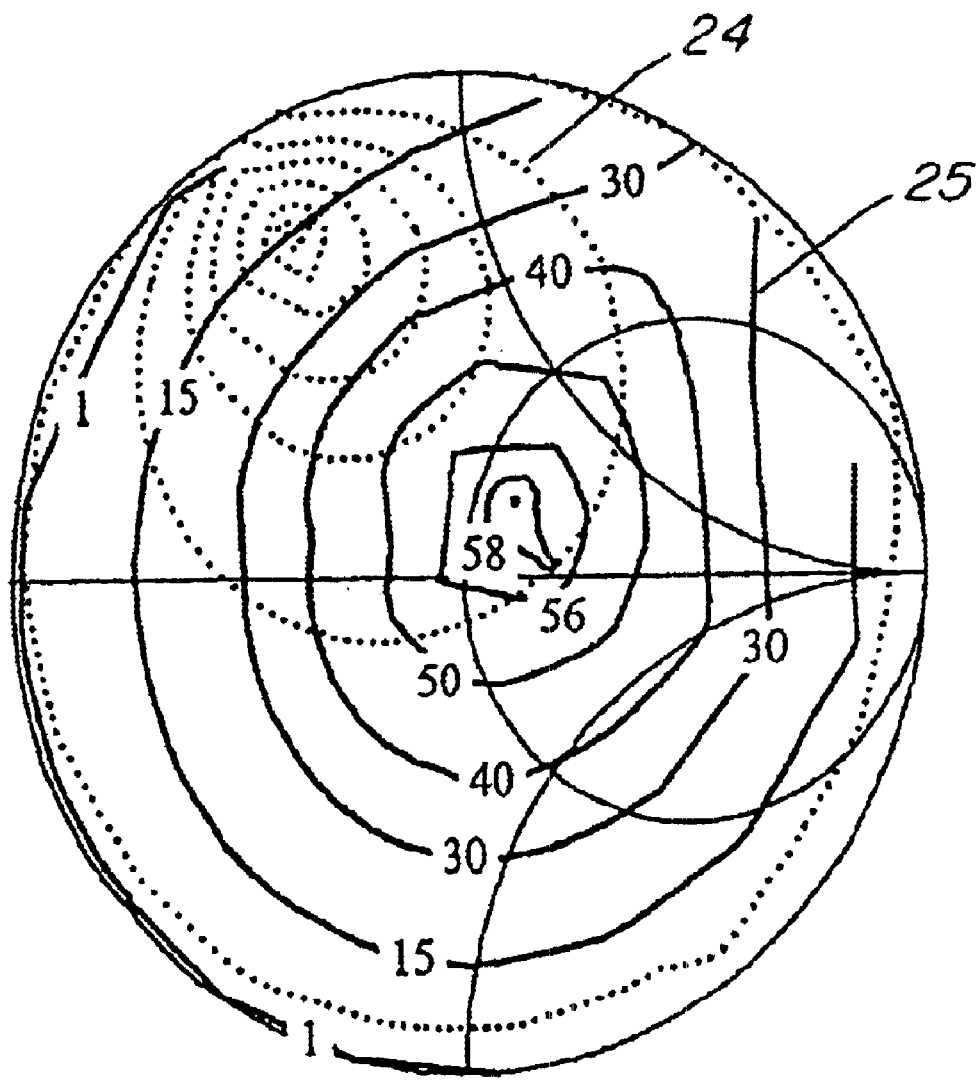
FIG. 6 shows extrinsic and intrinsic efficiency load-pull contours as measured by the analyzer.
Figure 7:
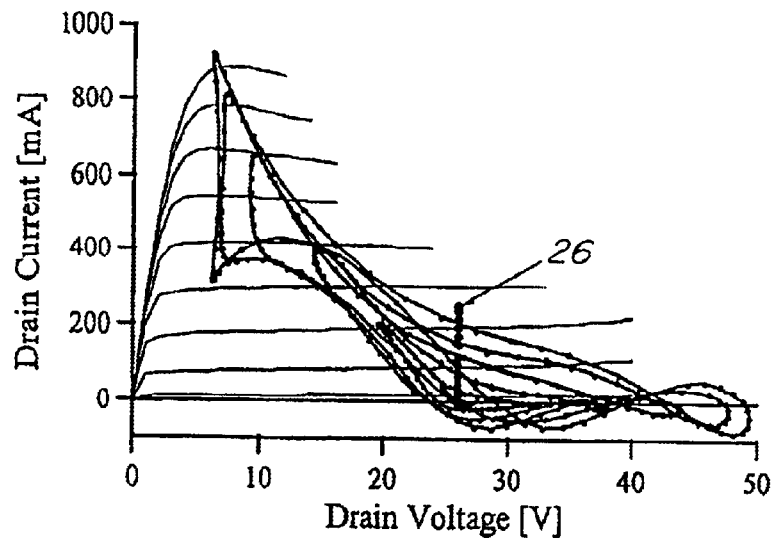
FIG. 7 is a graph showing RF load lines at increasing input power into optimum fundamental load, together with measured DC output characteristics.
Figure 8:
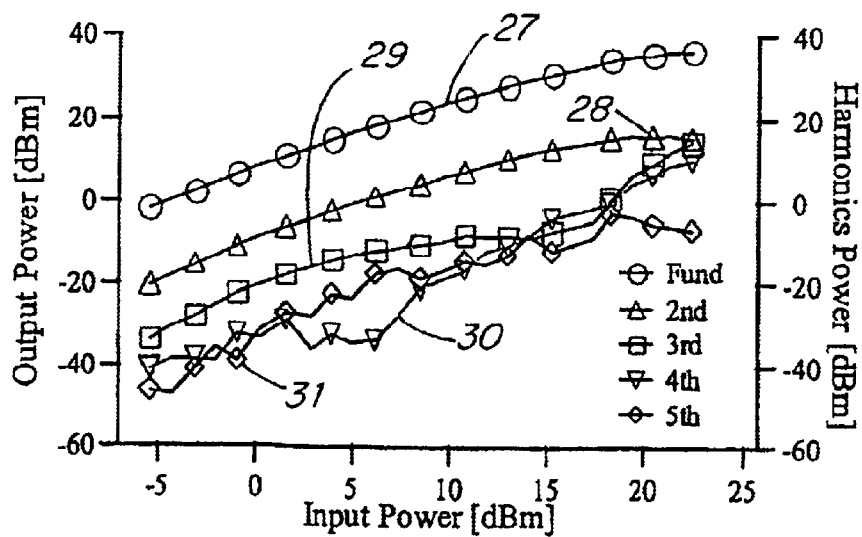
FIG. 8 is a graph showing harmonic powers at increasing input power into optimum fundamental load.

The present embodiment facilitates the improvement of the design of amplifier circuits including a transistor (for example an LDMOS device), by means of analysing the behavior of the transistor. A comprehensive fundamental frequency load pull investigation has been performed on the such an a LDMOS transistor as the DUT, biased at pinch-off with drain voltage $V_{DS}$=26 V. FIG. 6 shows the resulting load pull contours of drain efficiency, both at the extrinsic package leads plane (dotted lines 24) and after de-embedding at the current generator plane (solid lines 25). For the measurement of the load pull contours the second and third harmonic load were 50 Ω at the package leads. Contours generated for output power and power gain show similar behavior and give similar optimum loads. The optimum output reflection coefficient $\Gamma_{OPT}$=(0.78 @ 156°) at the package lead plane, resulting in an optimum admittance $Y_{OPT}$=(15.8−j5.2)mS at the current generator plane, gave a maximum drain efficiency η=59.5%, output power $P_{OUT}$= 3.91 W, power gain G=13.6 dB and a −1 dB compression point of 22.4 dBm. A swept input power measurement was performed on the device into this optimum fundamental load. FIG. 7 is a graph showing the RF dynamic load lines, the horizontal axis representing drain voltage in Volts, and the vertical axis representing drain current in mA, the self biasing points 26 also being shown in FIG. 7. FIG. 8 is a graph showing the output harmonic power content at increasing output power levels, the horizontal axis representing input power in dBm, the left vertical axis representing output power in dBm and the right vertical axis representing harmonic power in dBm. The graph of FIG. 8 has five plots, plot 27 (circles) represents the fundamental frequency, plot 28 (triangles) represents the first harmonic, plot 29 (squares) represents the second harmonic, plot 30 (inverted triangles) represents the third harmonic, and plot 31 (diamonds) represents the fourth harmonic. As can be seen from the measured RF load lines of FIG. 7, the device has an inherent almost accomplished class B harmonic loading, which is due to the output parasitic network. In particular, the large output capacitance creates almost a short circuit for the harmonics at the output current generator plane.

Figure 9A:
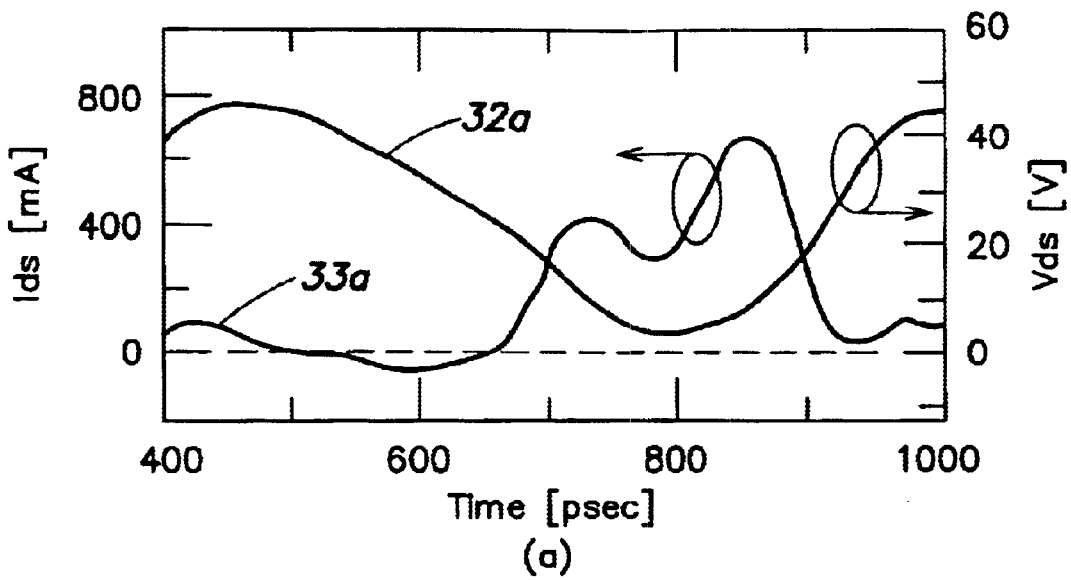
FIGS. 9a and 9b are graphs showing measured waveforms at an output current generator before and after harmonic tuning for efficiency.
Figure 9B:
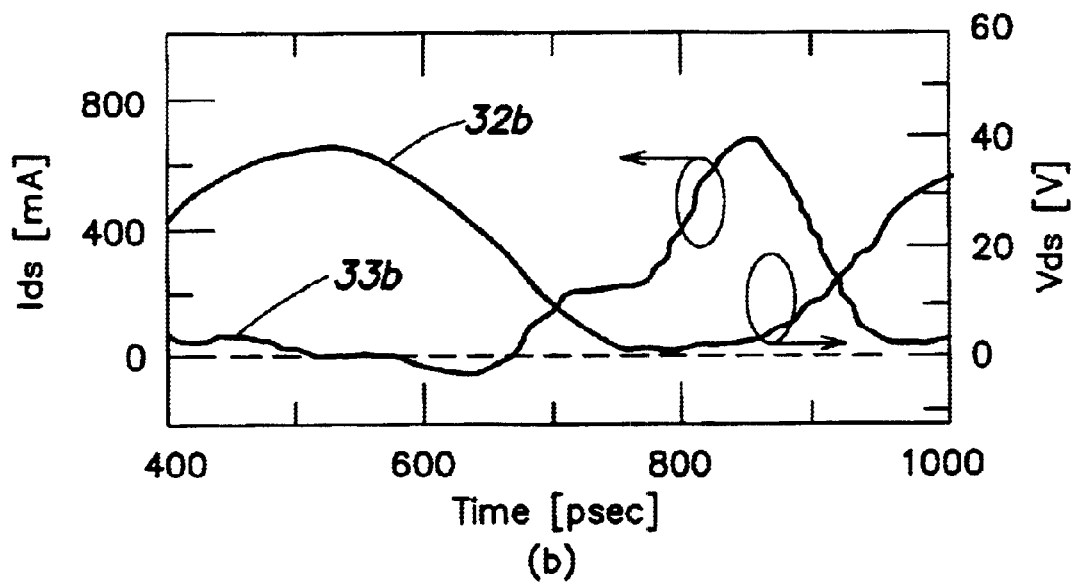

Harmonic tuning was performed on the device biased in the same bias point applying the fundamental load $\Gamma_{OPT}$ at the package lead while changing the second and third harmonic load at the current generator plane. The appropriate loads to be applied at the package leads were computed using the small signal model. A drive level of 19.2 dBm, backed off by approximately 3 dB from the −1 dB compression point, provides a high gain while still having a high harmonic content thus allowing for harmonic tuning. In order to investigate the effect of harmonic tuning on the device, a first measurement involved a 50Ω match at the second and third harmonic frequency at the current generator plane. This measurement resulted in an output power of 2.5 W with an efficiency η=47%. Class F loading was investigated next, applying a short at the second harmonic and open at the third harmonic frequency at the current generator plane. The result was an increase in both the output power and efficiency. In order to show how much harmonic loading at constant output power can improve efficiency, $V_{DS}$ was reduced until the device provided the same output power $P_{OUT}$=2.5 W, resulting in efficiency η=59%. This indicates that the increase in efficiency was achieved by squaring the voltage waveform. However, the obtained efficiency, which is far from the theoretical value achievable with three harmonic loads, suggests that the applied loading does not constitute the optimum class F loading. This can be readily verified by looking at the measured current and voltage waveforms. FIG. 9a is a graph showing the current waveform 33a and voltage waveform 32a before harmonic tuning and FIG. 9b is a graph showing current waveform 33b and voltage waveform 32b after harmonic tuning. It can be seen that the achieved gain in efficiency is due to a slightly more compressed (squared) voltage waveform as well as by a reduction of the area where high current and voltage values co-exist. These results agree with theoretical considerations that a short at the second harmonic and open at the third harmonic do not always constitute an optimum class F loading.

Figure 10A:
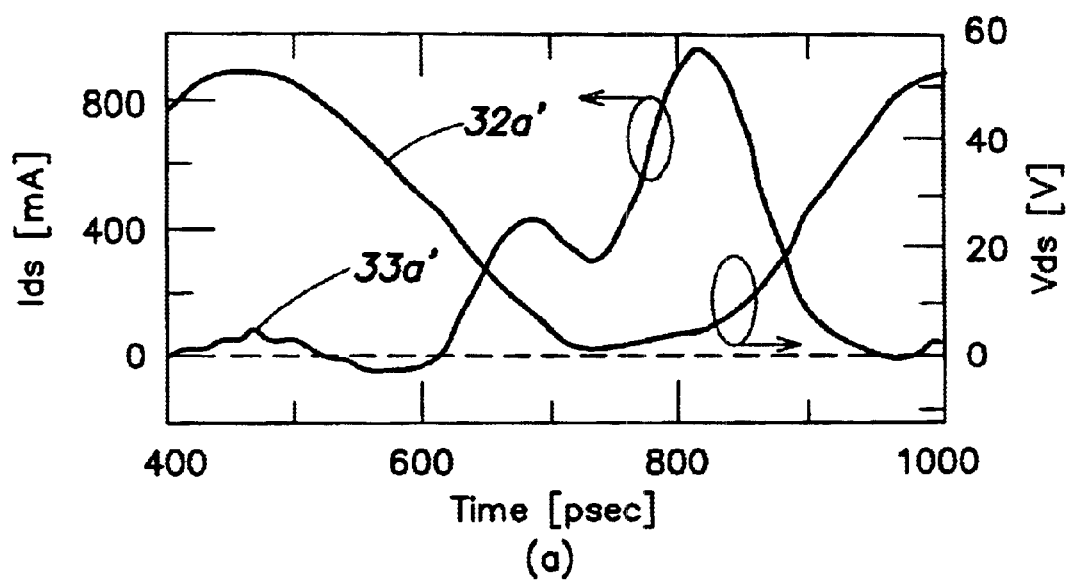
FIGS. 10a and 10b are graphs showing measured waveforms at an output current generator before and after waveform engineering.
Figure 10B:
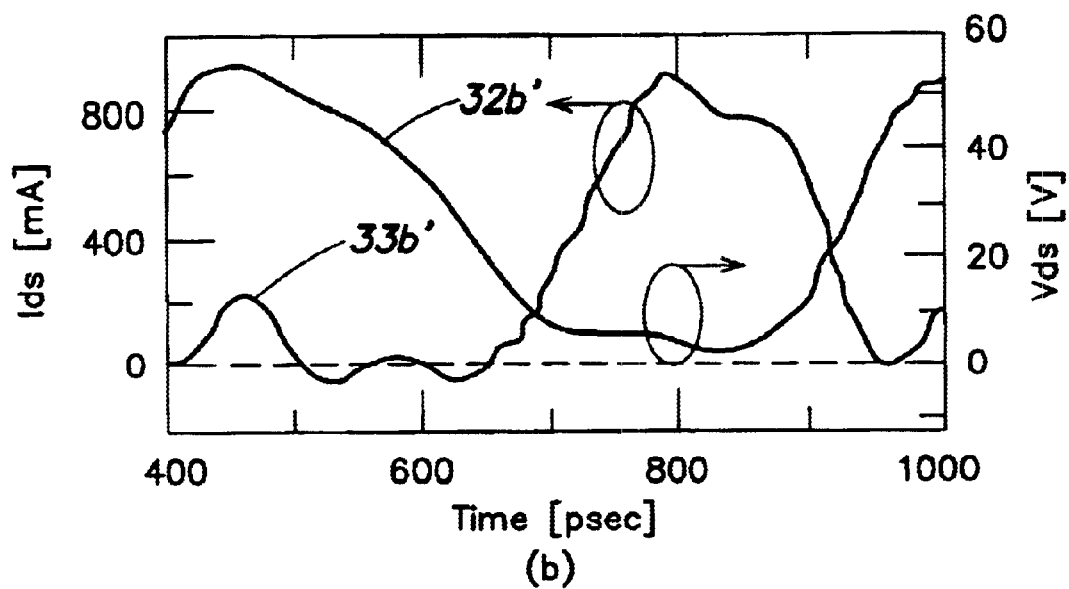

Applying the same traditional harmonic tuning approach to the device at the optimum operating conditions described above, improved overall neither the efficiency (η=59.5%) nor the output power ($P_{OUT}$=3.91 W). It was therefore decided to use directly the time domain waveform data as an alternative load-pull approach, with the aim of engineering the intrinsic current and voltage waveforms in order to improve the device performances. The results are shown in the graphs of FIGS. 10a and 10b, depicting output current 33a' and voltage 32a' waveforms before waveform engineering (FIG. 10a) and output current 33b' and voltage 32b' waveforms after (FIG. 10b) waveform engineering. While changing the fundamental load in order to increase the peak current, the second harmonic load is varied in order to reduce the dip within the current waveform. This results in an output power increase by 450 mW while maintaining the efficiency at η=59.5%. The loading for the third harmonic is then used to square the voltage waveform and to minimize the overlap between the voltage and current. The final current and voltage waveforms, shown in FIG. 10b, were a trade-off between reducing their overlap and increasing the current values in the area of low voltages. Overall, the tuning increased the output power by 800 mW (20%), giving in total $P_{OUT}$=4.71 W, without compromising gain and efficiency. The resulting harmonic loads at the current generator plane are: fundamental $\Gamma_{OPT}$=(0.535∠156°), second harmonic $\Gamma_{2ND}$=(1.0∠−57°), third harmonic $\Gamma_{3RD}$=(1.0∠−158°).

Figure 11:
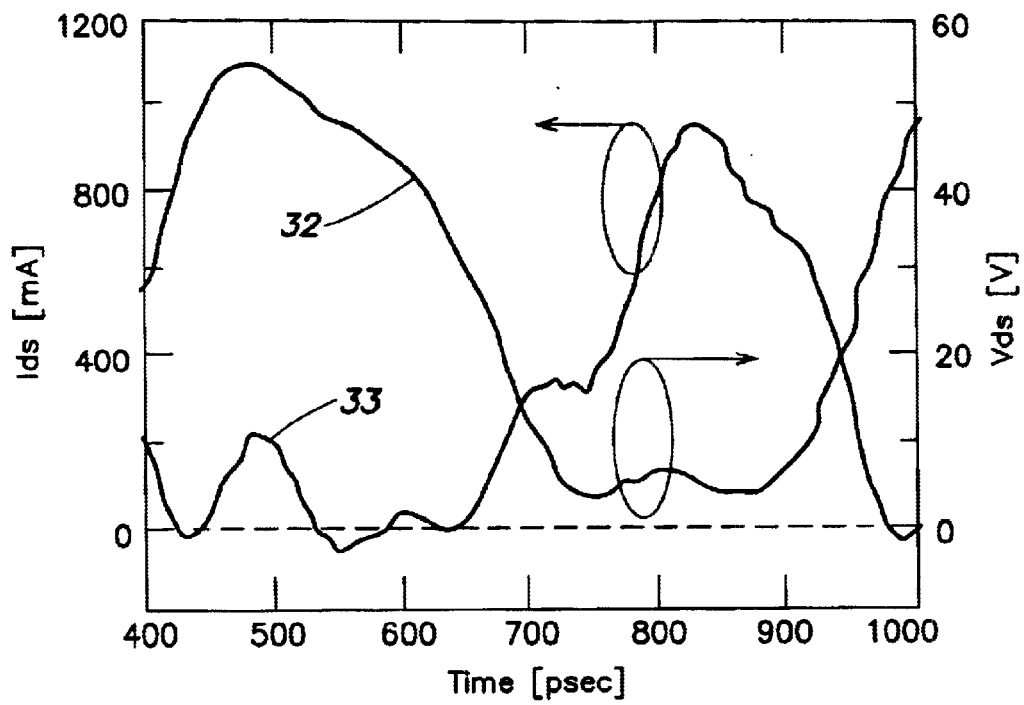
FIG. 11 is a graph showing measured waveforms at an output current generator after waveform engineering and 2 dB increase in drive level; and, FIG. 12 is a graph showing RF load lines measured at a given voltage and current.

FIG. 10b illustrates both the current and voltage signals having a generally square-shaped waveform, which explains the increase in output power due to the increased fundamental current swing but not an increase in efficiency due to the increased quiescent point of a squared waveform. The fact that the gain has not changed suggests that further improvement in efficiency and output power could be achieved by increasing the drive level, but neither the efficiency nor output power are found to increase significantly with higher drive level. Besides, a dipping in the current waveform, shown in FIG. 11 for a drive level increased by 2 dB, appears while the output power is increased. This indicates a drive dependent effect, which prevents the device from reaching its optimum performance.

In all of FIGS. 9a, 9b, 10a, 10b, and 11 the current (left vertical axis) is in mA, the voltage (right vertical axis) is in Volts, and the horizontal axis is in pico-seconds.

It has been found that the recurring current dips with increasing drive level do not result from the injection of harmonic components from the drive amplifier 5 or from other device non-linearities in the low-pass filter 6 for example.

Figure 12:
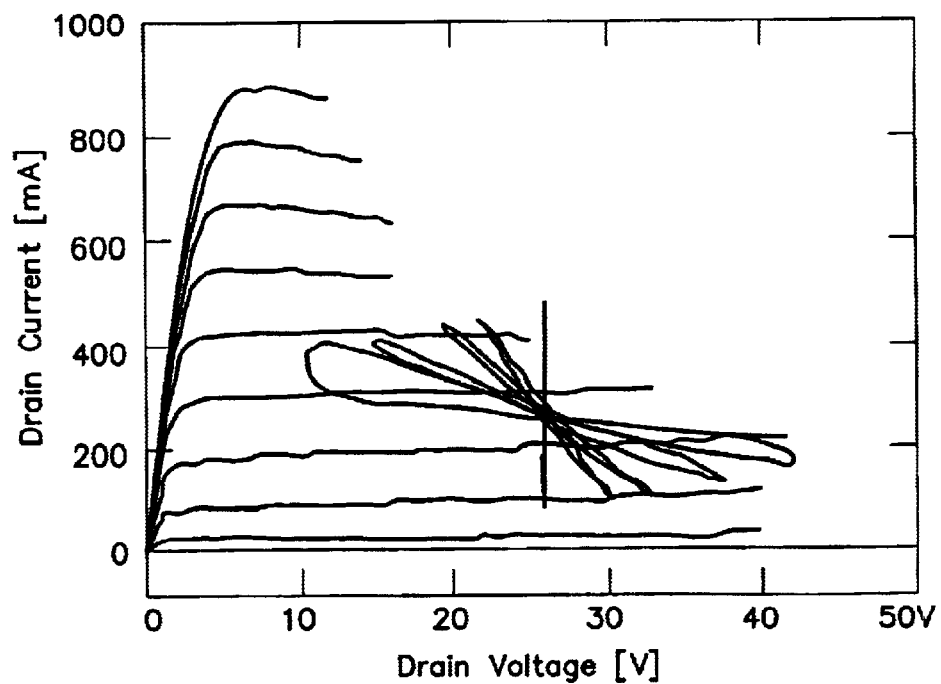

The origin of the current distortion, was identified by analysing the device for a set of load lines, all measured at the same drive signal level, namely with $V_{DS,Q}$=26 V and $I_{DS,Q}$=260 mA. FIG. 12 shows the resulting measured RF dynamic load lines on a graph, where the horizontal axis representing drain voltage in Volts, and the vertical axis representing drain current in mA. The corresponding measured current waveforms present an increasing distortion for increasing output voltage swing. The output current consists of a real current component, whose dependency on $V_{DS}$ is defined by the output conductance, and a displacement current term. Since the voltage waveform does not progress into the knee region, it was assumed that the transconductance does not change significantly along the measured load lines. It is believed from measurements conducted with the analyzer that the origin of the current distortion observed is caused by non-linear capacitance effects. Therefore, in order to further improve the efficiency of power amplifiers based on LDMOS devices non-linear capacitance will have to be analysed and accounted for.

It will be readily apparent to the skilled person that various modifications may be made to the above-described embodiment without departing from the spirit of the invention. For example, further improvements could be made to the present embodiment such as accounting for non-idealities of the MTA input channels, such as mismatch and asymmetry between the two channels. Therefore, the foregoing description should not be considered limiting of the scope of the invention, which is defined by the following claims when properly construed.

What is claimed is:

1. A method of measuring the response of an electronic device to a high frequency input signal, the method comprising the steps of;
    a) providing an electronic device having a port able to receive and/or send high frequency signals,
    b) providing a measurement system including a measurement unit for measuring high frequency signals and including a signal path connecting the measurement unit to the port of the device,
    c) applying a signal to the device and measuring with the measurement unit via the signal path two independent waveforms at the port of the device, and
    d) processing signals representative of the two independent waveforms as measured by the measurement system, with the use of calibration data, to compensate for the influence of the measurement system on the two independent waveforms between the port of the device and the measurement unit and to produce output signals from which the absolute values of the magnitude and phase of waves at the port of the device may be directly ascertained, wherein
        the calibration data includes data ascertained by making measurements with a real network, the real network being connected to a portion of the signal path that in use connects to the port of the device, the influence of the real network on the measurements made with the real network being known.

2. A method according to claim 1 wherein the device has a plurality of ports able to receive and/or send high frequency signals, and steps c) and d) are conducted in respect of the resulting independent waveforms at each of at least two ports of the device.

3. A method according to claim 1, wherein at least part of the performance of step d) effectively translates the measurement reference plane from the measurement unit to the port of the device.

4. A method according to claim 1, wherein the device is a non-linear electronic device.

5. A method according to claim 1, wherein the device is a high power device and step c) of the method includes applying a high power signal to the device.

6. A method according to claim 1, wherein the measurement unit is able to measure high voltage waveforms having frequencies above 500 Mhz.

7. A method according to claim 1, wherein the measurement unit is a microwave transition analyzer.

8. A method according to claim 1, wherein step c) of the method includes applying a waveform to the device, the waveform having a component having a fundamental frequency substantially at a first frequency and having a component having a second frequency substantially at a frequency equal to an integer multiple of the first frequency.

9. A method according to claim 1, wherein the method includes a step of producing the output signals substantially in real-time.

10. A method according to claim 1, wherein the method includes a step of producing the output signals in a graphical form able to be viewed by an operator.

11. A method of calibrating a measurement system for measuring the response of an electronic device to a high frequency input signal, the method comprising the steps of:
    providing a measurement system including a measurement unit for measuring high frequency signals and including a signal path connected to at least one input of the measurement unit and enabling the measurement unit to be connected to a port of a device,
    ascertaining first calibration data regarding the measurement system,
    the first calibration data enabling, when the measurement system is connected to a device to which signals are applied, the processing of the resulting signals, said resulting signals being representative of independent waveforms at a port of the device resulting from the applied signals, the waveforms being measured by the measurement system via the signal path, to compensate for the influence of the measurement system on the independent waveforms between the port of the device and the input of the measurement unit, the first calibration data being sufficient to enable signals representative of a function of the independent waveforms at the port of the device to be calculated, and ascertaining second calibration data concerning said function, so that when the measurement system is used to measure the behavior of a device to which it is, in use, connected, the signals as measured by the measurement unit may be processed with the use of the first and second calibration data to produce output signals from which the absolute values of the magnitude and phase of waves at the port of the device may be directly ascertained, wherein the method includes ascertaining the second calibration data by making measurements with a real network, the real network being connected to a portion of the signal path that in use connects to the port of the device, the influence of the real network on the measurements made with the real network being known.

12. A method according to claim 11, wherein the first calibration data effectively enables the measurement reference plane to be translated from the measurement unit to the ports of the device.

13. A method according to claim 11, wherein the step in which the second calibration data is ascertained includes providing a connection connecting a measuring unit and said at least a portion of the signal path, measuring voltage waveforms at said portion via the connection, ascertaining the influence of the connection on the measurement of the voltage waveforms, and then processing the measured voltage waveforms to produce signals representative of the voltage waveforms at said portion.

14. A method according to claim 13, wherein the behavior of the real network in response to the application of the standards is measured by the measurement unit.

15. A method according to claim 11, wherein the first calibration data is sufficient in use of the measurement system to enable vector corrected s-parameters relating to the independent waveforms at a port of the device to be calculated.

16. A method according to claim 15, wherein the second calibration data enables in use of the measurement system two independent waveforms at the port of the device to be calculated from such vector corrected s-parameters.

17. A method according to claim 11, wherein the measurement unit is able to measure high voltage waveforms having frequencies above 500 Mhz.

18. A method according to claim 11, wherein the measurement unit is a microwave transition analyzer.

19. A method according to claim 11, wherein the first and second calibration data is calculated on the basis of a network error model modeling the influence of the measurement system on waves traveling across the system wherein the error model has a plurality of unknown parameters, the model being such that at least the majority of the unknown parameters in the model are independent of the origin of the independent waveforms.

20. A method according to claim 11, wherein the real network is formed entirely of passive components.

21. A method of measuring the response of an electronic device to a high frequency input signal, the method comprising the steps of:

a) providing an electronic device having a first port and a second port, the ports being able to receive and/or send high frequency signals, b) providing a measurement system including a measurement unit for measuring high frequency signals and including a first signal path connecting the measurement unit to the first port of the device and a second signal path connecting the measurement unit to the second port of the device, c) applying one or more signals to the device, measuring with the measurement unit via the first signal path two independent waveforms at the first port of the device and measuring with the measurement unit via the second signal path two independent waveforms at the second port of the device, and d) processing signals representative of the waveforms as measured by the measurement system, with the use of calibration data, to compensate for the influence of the measurement system on the two independent waveforms between the ports of the device and the measurement unit to produce output signals from which the absolute values of the magnitude and phase of waves at the first port of the device and the absolute values of the magnitude and phase of waves at the second port of the device may be directly ascertained, wherein the calibration data includes data ascertained by making measurements with a real network, the real network being connected to a portion of the signal path that in use is able to connects to at least one of the ports of the device, the influence of the real network on the measurements made with the real network being known.

22. A method of calibrating a measurement system for measuring the response of a two port electronic device to a high frequency input signal, the method comprising the steps of;

providing a measurement system including a measurement unit for measuring high frequency signals and including a first signal path connected to a first input port of the measurement unit and enabling the measurement unit to be connected to a first port of a device and a second signal path connected to a second input port of the measurement unit and enabling the measurement unit to be connected to a second port of a device, ascertaining first calibration data regarding the measurement system, the first calibration data being sufficient to enable signals representative of waveforms measured at the input ports of the measurement unit to be processed to compensate for the influence of the measurement system on the waveforms between i) the parts of the signal paths for connecting to the ports of a device and ii) the input ports of the measurement unit so that in use of the measurement system signals representative of a function of waves at the fist and second ports of a device under test may be produced, and ascertaining second calibration data concerning said function, by making measurements with a real network, the real network being connected to a portion of the signal path that in use is able to connect to at least one of the ports of the device, the influence of the real network on the measurements made with the real network being known, wherein when the measurement system is used to measure the behavior of a device, signals as measured by the measurement unit may be processed with the use of the first and second calibration data to produce output signals from which the absolute values of the magnitude and phase of waves at the first port of the device and the absolute values of the magnitude and phase of waves at the second port of the device may be directly ascertained.

23. A method of measuring the response of an electronic device to a high frequency input signal, the method comprising the steps of:

1) providing an electronic device having a first port and a second port, the ports being able to receive and/or send high frequency signals, the device being suitable for use as a high power amplifying device in a mobile telecommunications base station, 2) providing a measurement system including a measurement unit for measuring high frequency signals and including a first signal path connecting the measurement unit to the first port of the device and a second signal path connecting the measurement unit to the second port of the device, 3) applying one or more signals to the device, so as to effect an active harmonic load pull on the device, measuring with the measurement unit via the first signal path two independent waveforms at the first port of the device and measuring with the measurement unit via the second signal path two independent waveforms at the second port of the device, and 4) processing signals representative of the waves as measured by the measurement system to compensate for the influence of the measurement system on the two independent waveforms between i) the ports of the device and ii) the measurement unit and to extract output signals from which the absolute values of the magnitude and phase of waves at the first port of the device and the absolute values of the magnitude and phase of waves at the second port of the device may be directly ascertained, wherein the processing of the signals includes making use of data that has been ascertained by making measurements with a real network, the real network being connected to a portion of the signal path that in use is able to connect to at least one of the ports of the device, the influence of the real network on the measurements made with the real network being known.

24. A method of calibrating a measurement system capable of performing the method of claim 23, the method including the steps of:

ascertaining first calibration data sufficient, in use of the measurement system, to ascertain vector corrected s-parameters by processing signals representative of waves as measured by the measurement system via the first and second signal paths to compensate for the influence of the measurement system on the waves between i) the ports of the device and ii) the measurement unit, providing a pre-calibrated connection between the measurement unit and a further part of the measurement system, measuring voltage waveforms via the connection, compensating for the influence of the connection on the measurement of the voltage waveforms to produce a compensated voltage waveform, and ascertaining second calibration data comprising a scaling parameter in view of the compensated voltage waveform, whereby the first and second calibration data facilitate the production of output signals relating to the behavior of a device under test, the output signals enabling the absolute values of the magnitude and phase of waves at the fist port of the device and the absolute values of the magnitude and phase of waves at the second port of the device to be directly ascertained.

25. A method of measuring the response of an electronic device to a high frequency input signal, the method comprising the steps of:

i) providing an electronic device having a port, ii) providing a microwave transition analyzer (MTA) and connecting the MTA to the port of the device, iii) applying a high frequency signal to the device and measuring with the MTA two independent waveforms, the waveforms being measured at the MTA, and the MTA producing output signals as a result of the measurements made by the MTA, and iv) processing the output signals from the MTA with the use of an error model to produce data representative of current and/or voltage time-domain waveforms at the port, wherein the error model used in the processing of the output signals is a non-directional network error model and comprises parameters which have been previously ascertained.

26. A method according to claim 25, wherein the method further includes ascertaining the parameters of the error model by performing the following calibration steps:

v) applying a high frequency signal to a part of the measurement system for connecting to the device and measuring with the MTA two resulting independent waveforms under a plurality of different conditions, the waveforms being measured at the MTA, and the MTA producing output signals as a result of the measurements made by the MTA, vi) processing the output signals from the MTA to produce first data representing at least one error parameter of the error model, the processing including calculating the ratio of two incident and/or reflected voltage waveforms from the waveforms measured by the MTA, the first data being sufficient to enable the production, when measuring the response of a device, of data representative of at least one adjusted s-parameter, the adjustment compensating for the difference between the or each s-parameter as measured by the MTA and the real value of the or each s-parameter at a port of the device, vii) ascertaining a scaling parameter by connecting via a test signal path the MTA to a part of the measurement system for connecting to the device, measuring a voltage waveform with the MTA via the test signal path, producing data regarding a compensated voltage waveform by compensating for the influence of the test signal path on the measuring of the waveform, and performing a calculation using the data regarding the compensated voltage waveform to ascertain the scaling parameter, and viii) calculating at least one error parameter from the scaling parameter.

27. A method according to claim 26, the method further for calibrating a measurement system and further comprising enabling the measurement system to process signals measured by the measurement unit during analysis of the behavior of a device under test to produce signals representative of absolute current and low voltage time-domain waveforms at a port of the device under test.

28. Waveforn analyzer for measuring the response of an electronic device to a high frequency input signal, the analyzer including:
- an input connection for connecting to a port of a device to be analyzed,
- a measurement system including a measurement unit and a signal path, the signal path connecting the measurement unit to the input connection, the analyzer being so arranged that the measurement unit is able to measure in use via the signal path independent waveforms at the port of the device,
- a signal generator able to send high frequency signals to a port of a device to be analyzed,
- a processor connected to the measurement system, and
- a data store for holding data accessible by the processor, wherein
  the processor is programmed to be able, in use of the analyzer:
  - to process signals received from the measurement unit,
  - to access calibration data held in the data store,
  - to process data representative of waves as measured by the measurement system, and
  - to compensate, with the use of the calibration data, for the influence of the measurement system on the waves between the port of the device and the measurement unit, and to produce output data from which the absolute values of the magnitude and phase of waves at the port of the device may be directly ascertained, and
  wherein the processor is so programmed and the analyzer is so arranged that at least a portion of said calibration data may be ascertained by making measurements with a real network, the real network being connected to a portion of the signal path that in use connects to the port of the device, the influence of the real network on the measurements made with the real network being known.

29. Waveform analyzer for measuring the response of an electronic device to a high frequency input signal, the analyzer including:
- connection means for connecting to one or more ports of a device to be analyzed,
- measuring means for measuring via one or more signal paths independent waveforms at the connection means,
- signal generating means for sending high frequency signals to a port of the device to be analyzed,
- processing means for processing signals from the measuring means, and
- calibrating means for ascertaining calibration data, wherein, in use of the analyzer when at least one port of a device is connected to the connection means, the device receiving signals from the signal generating means, the processing means is able:
  - to process data representative of waves as measured by the measuring means, both to compensate for the difference between the independent waveforms as measured and the waves at the or each of said one or more ports, and to produce output data from which the absolute values of the magnitude and phase of waves at the or each of said one Or more ports of the device may be directly ascertained, and wherein the analyzer is so arranged that the processor makes use of data that has been ascertained by making measurements with a real network, the real network being connected to a portion of the signal path that in use connects to the port of the device, the influence of the real network on the measurements made with the real network being known.

30. The invention according to any one of claims 1, 21, 23, 25, 28 or 29, wherein the independent waveforms include two types of waveform selected from the group consisting of the resulting incident waveform, the resulting reflected waveform, the resulting current waveform and the resulting voltage waveform.

31. A method of improving the design of a high power high frequency electronic circuit according to any of claims 1, 21, 23, or 25, further comprising outputting data relating to current and voltage waveforms at a port of the device, varying harmonic loads on the device, analyzing the outputted data relating to current and voltage waveforms to assess the loads that facilitate the better performance of the device, and designing an improved high power high frequency electronic circuit including the device, the circuit being designed in consideration of the results of the analysis so performed.

32. A method of manufacturing a high power high frequency electronic circuit, the method including the steps of designing the circuit in accordance with the method of claim 31 and manufacturing the high power high frequency electronic circuit so designed.

33. A method according to claim 32, wherein the circuit is a signal amplifier and the device is a transistor.

34. A method of improving the design of a high power high frequency electronic circuit according to any one of claims 1, 21, 23, or 25, and then tuning the circuit in response to the results of the analysis so performed.

35. A method of improving the design of a high power high frequency electronic circuit using apparatus according to any of claims 28 or 29, comprising:
- outputting data relating to current and voltage waveforms at a port of the device,
- varying harmonic loads on the device,
- analyzing the outputted data relating to current and voltage waveforms to assess the loads that facilitate the better performance of the device, and
- designing an improved high power high frequency electronic circuit including the device,
- the circuit being designed in consideration of the results of the analysis so performed.

36. A method of manufacturing a high power high frequency electronic circuit, the method including the stops of designing the circuit in accordance with the method of claim 35 and manufacturing the high power high frequency electronic circuit so designed.

37. A method according to claim 36, wherein the circuit is a signal amplifier and the device is a transistor.

38. A method of improving the design of a high power high frequency electronic circuit using apparatus according to any one of claims 28 or 29, comprising:
- analyzing the circuit using the apparatus, and
- tuning the circuit in response to the results of the analysis so performed.

* * * * *